(12) United States Patent
Oh et al.

(10) Patent No.: US 9,257,195 B2
(45) Date of Patent: Feb. 9, 2016

(54) MEMORY CONTROLLER OPERATING METHOD AND MEMORY SYSTEM INCLUDING MEMORY CONTROLLER

(71) Applicants: Eun-Chu Oh, Hwaseong-Si (KR);
Eun-Cheol Kim, Seongnam-Si (KR);
Jun-Jin Kong, Yongin-Si (KR);
Kwang-Hoon Kim, Hwaseong-Si (KR);
Hong-Rak Son, Anyang-Si (KR)

(72) Inventors: Eun-Chu Oh, Hwaseong-Si (KR);
Eun-Cheol Kim, Seongnam-Si (KR);
Jun-Jin Kong, Yongin-Si (KR);
Kwang-Hoon Kim, Hwaseong-Si (KR);
Hong-Rak Son, Anyang-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/309,959

(22) Filed: Jun. 20, 2014

(65) Prior Publication Data

US 2015/0162093 A1    Jun. 11, 2015

(30) Foreign Application Priority Data

Oct. 2, 2013    (KR) .......................... 10-2013-0117859

(51) Int. Cl.
*G11C 16/04*    (2006.01)
*G11C 16/34*    (2006.01)
*G11C 16/16*    (2006.01)
*G11C 16/26*    (2006.01)

(52) U.S. Cl.
CPC ............ *G11C 16/3445* (2013.01); *G11C 16/16* (2013.01); *G11C 16/26* (2013.01)

(58) Field of Classification Search
CPC ........ G11C 16/08; G11C 16/10; G11C 16/16; G11C 16/14
USPC ............................ 365/185.11, 185.29, 185.22
See application file for complete search history.

(56) References Cited

U.S. PATENT DOCUMENTS

| | | | |
|---|---|---|---|
| 8,046,645 B2 | 10/2011 | Hsu et al. | |
| 8,213,230 B2 | 7/2012 | Kim et al. | |
| 2009/0327837 A1 | 12/2009 | Royer et al. | |
| 2010/0085820 A1 | 4/2010 | Nagashima | |
| 2012/0173920 A1* | 7/2012 | Park .............................. | 714/6.11 |
| 2012/0226963 A1 | 9/2012 | Bivens et al. | |
| 2012/0254680 A1 | 10/2012 | Oh et al. | |
| 2012/0284469 A1 | 11/2012 | Seo | |
| 2012/0327713 A1 | 12/2012 | Parat et al. | |

FOREIGN PATENT DOCUMENTS

KR    20120098068 A    9/2012
KR    20120109244 A    10/2012

* cited by examiner

*Primary Examiner* — Huan Hoang
(74) *Attorney, Agent, or Firm* — Volentine & Whitt, PLLC

(57) ABSTRACT

A method of operating a memory controller in a memory system including a nonvolatile memory device includes; erasing memory cells of a target memory block of the non-volatile memory device on a block basis, and then searching for a bad memory cell by a performing an erase verifying operation, comparing a threshold voltage of the bad memory cell to a reference voltage to generate comparison results, and designating as a bad area one of the entire target memory block, and a sub-block of the target memory block in response to the comparison results.

20 Claims, 17 Drawing Sheets

MEMORY CONTROLLER OPERATING METHOD AND MEMORY SYSTEM INCLUDING MEMORY CONTROLLER

This application claims priority under 35 U.S.C. §119 to Korean Patent Application 10-2013-0117859 filed on Oct. 2, 2013, the subject matter of which is hereby incorporated by reference.

BACKGROUND

The inventive concepts relates generally to methods of operating a memory controller and memory systems including a memory controller.

Memory devices including nonvolatile memory devices operatively provide memory cells that may be used during the operation of a memory system and/or a constituent host device to store data. Available (i.e., functionally useable) memory space is always an important consideration as it usually constitutes a scarce system resource. Thus, steps must be taken to preserve the not only the size of available memory space but also its integrity in relation to data operations.

Thus, an important balance must be struck by memory system designers between hazarding the integrity of stored data, and to quickly discarding (i.e., designating as "bad") weak memory cells or portions of memory space including weak memory cells.

SUMMARY

Certain embodiments of inventive concept provide a memory controller operating method, as well as memory systems including a memory controller, that effectively enlarges the useful data storage space provided by one or more nonvolatile memory device(s).

According to one embodiment of inventive concept, there is provided a method of operating a memory controller, the method comprising; erasing memory cells of a target memory block of the non-volatile memory device on a block basis, after erasing the memory cells of the target memory block, searching for a bad memory cell by a performing an erase verifying operation on the target memory block, comparing a threshold voltage of the bad memory cell to a reference voltage to generate comparison results, and designating as a bad area one of the entire target memory block, and a sub-block of the target memory block in response to the comparison results.

According to another embodiment of inventive concept, there is provided a method of operating a memory controller in a memory system including a nonvolatile memory device, the method comprising; erasing memory cells of a target memory block of the non-volatile memory device on a block basis, after erasing the memory cells of the target memory block, differentiating between normal memory cells and a bad memory cell by a performing an erase verifying operation on the target memory block, comparing a threshold voltage of the bad memory cell to a reference voltage to generate one of first, second and third comparison results, and thereafter, executing a program/read operation directed to memory cells of the target memory block only if the first comparison result or the second comparison results is generated, and during the execution of the program/read operation, providing both good word lines connected to normal memory cells and a bad word line connected to the bad memory cell with a nominal pass voltage if the first comparison result is generated, else providing only the good word lines with the nominal pass voltage while providing the bad word line with an elevated pass voltage higher than the nominal pass voltage if the second comparison result is generated.

According to another embodiment of inventive concept, there is provided a memory system comprising; a nonvolatile memory device including a three dimensional memory cell array stacked on substrate and including a plurality of memory blocks each including a plurality of memory cell layers, and a memory controller configured to control operation of the non-volatile memory device and including a bad area management unit configured to designate a bad area of the memory cell array including a bad memory cell. The bad area management unit is configured to erase a target block among the plurality of blocks, and then select a memory cell layer among the plurality of memory cell layers of the target memory block including a bad memory cell, compare a threshold voltage of the bad memory cell with a first reference voltage and a second reference voltage to generate a first comparison result, a second comparison result or a third comparison, and is further configured to designate the entire target memory block as the bad area in response to the third comparison result, and a sub-block of the target memory block as the bad area in response to the first comparison result and the second comparison result.

BRIEF DESCRIPTION OF THE DRAWINGS

Certain embodiments of inventive concept are illustrated in relevant portion in the accompanying drawings, in which.

DETAILED DESCRIPTION OF EMBODIMENTS

Certain embodiments of the inventive concept will now be described in some additional detail with reference to the accompanying drawings. However, it should be noted that the inventive concept may be variously embodied and should not be construed as being limited to only the illustrated embodiments. Throughout the drawings and written description like reference numbers and labels are used to denote like or similar elements.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of this disclosure. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 1:
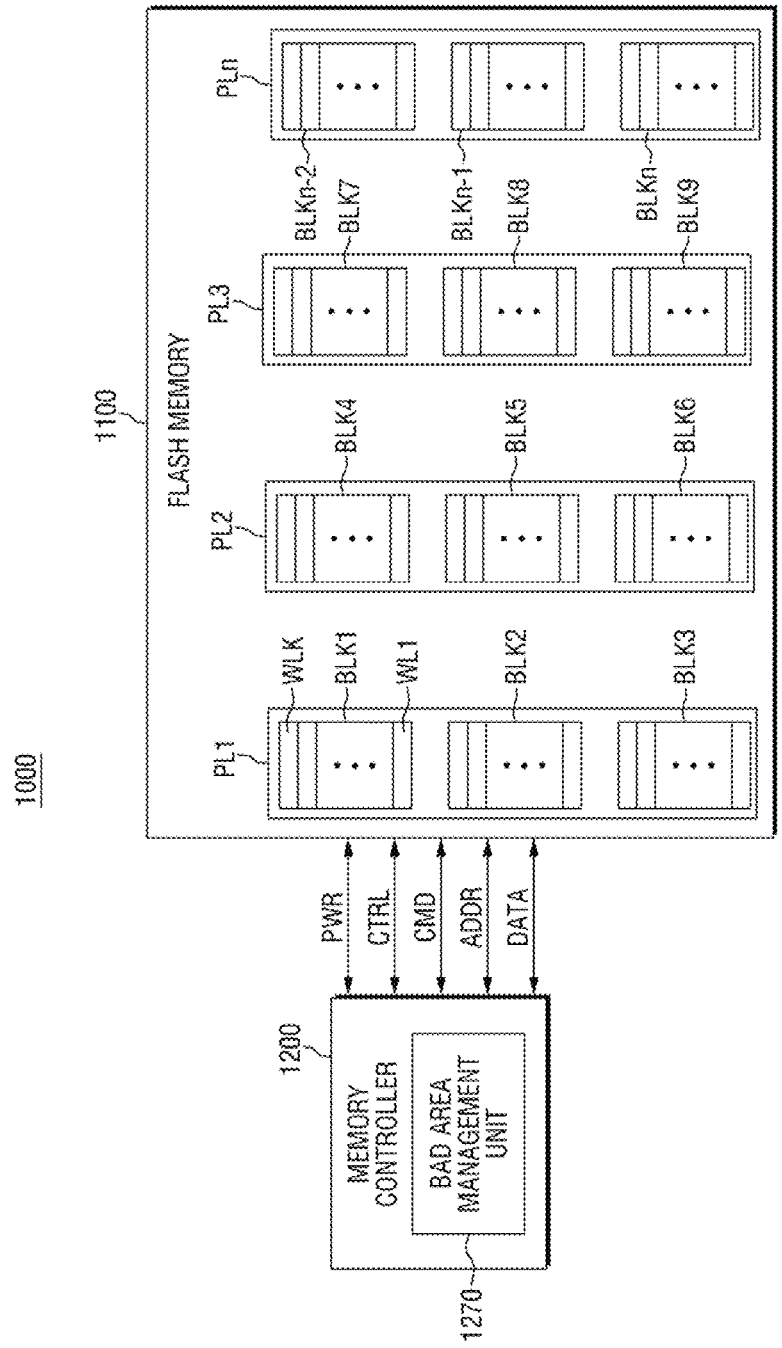
FIG. 1 is a block diagram illustrating a nonvolatile memory system 1000 according to an embodiment of inventive concept.

FIG. 1 is a block diagram illustrating a nonvolatile memory system 1000 according to certain embodiments of inventive concept.

Referring to FIG. 1, a nonvolatile memory system 1000 generally includes a nonvolatile memory device 1100 and a memory controller 1200. The nonvolatile memory system 1000 may include nonvolatile memory-based data storage mediums such as a memory card, a USB memory, a Solid State Drive (SSD), and the like.

As is conventionally understood, the nonvolatile memory device 1100 will perform erase, write, and read operations under the control of the memory controller 1200. For this, the nonvolatile memory device 1100 may receive a command CMD, an address ADDR, and data via input/output lines. The nonvolatile memory device 1100 may receive a power PWR via a power line and a control signal CTRL via a control line. The control signal CTRL may include a command latch enable signal CLE, an address latch enable signal ALE, a chip enable signal nCE, a write enable signal nWE, a read enable signal nRE, but example embodiments of inventive concepts are not limited thereto.

The nonvolatile memory device 1100 may include one or more of a flash memory, an electrically erasable programmable read only memory (EEPROM), a ferroelectrics random access memory (FRAM), a phase change random access memory (PRAM), resistive random access memory (ReRAM), and a magneto resistive random access memory (MRAM). Although a NAND flash memory device is assumed for the example illustrated in FIG. 1, the inventive concept is not limited thereto. Referring to FIG. 1, the nonvolatile memory device 1100 may serve as a storage unit configured to store data provided from the memory controller 1200.

In certain embodiments, the nonvolatile memory device 1100 will include a plurality of memory cell arrays respectively configured to store data. Each of the memory cell arrays may include a plurality of planes PL1 through PLn ('n' being a natural number), and each of the planes PL1 through PLn may include a plurality of blocks BLK1 through BLKm ('m' being a natural number). Further, each of the blocks BLK1 through BLKm may include a plurality of word lines WL1 through WLk ('k' being a natural number). Each of the blocks BLK1 through BLKm may be unitarily operated during an erase operation as an "erase unit", such that all memory cells of an identified block are erased in response to a single erase command (e.g., simultaneously erased). Each word line may be designated as a "read/program unit" during both program and read operations, such that all memory cells connected to the designated word line are programmed during the program operation and read during the read operation (e.g., simultaneously programmed or read). The memory cells of a given plurality of blocks may be arranged in a three dimensional ("3D") structure wherein memory cells are vertically stacked on a substrate extending primarily in at least one horizontal direction. In this context the terms "vertical" and "horizontal" are arbitrarily defined.

Assuming that the nonvolatile memory device 1100 is implemented using flash memory, it may be further assumed that the flashed memory includes one or more "bad area(s)" that result from defects in the fabrication of the constituent components forming the memory cells of one or more blocks, and/or erroneous operating conditions (e.g., column fail, disturbance, wear-out, etc.). In this context a "bad area" may be variously sized (and/or designated within operating methods consistent with inventive concept) ranging from a single bad memory cell to an entire memory block designated as a bad memory block because it contains one or more bad memory cells.

As shown in FIG. 1, the memory controller 1200 may include a bad management unit 1270. The bad management unit may be configured to selectively manage one or more areas in the available memory space provided by the nonvolatile memory device 1100 as a bad area. For example, the bad management unit 1270 may be configured to sequentially perform an erase operation on a memory block of the nonvolatile memory device 1100, and a search operation for bad memory cell(s) using (e.g.,) an erase verify operation memory device 1110. The bad management unit 1270 may be further configured to compare the threshold voltage of the bad memory cell to one or more reference voltage(s).

Based on this comparison, for example, the bad area management unit 1270 may designate the particular word line (or a particular grouping of word lines) connected to an identified bad memory cell as a bad area, or alternatively, it may designate the particular memory block including the bad memory cell as a bad area.

By designating "bad area(s)" on a word line basis (or sub-memory block basis), other word lines extending across a memory block including at least one bad memory cell may nonetheless be designated as not bad areas because they connect only "good" (or normally operating) memory cells. In this manner, the bad area management unit 1270 may effectively increase the available data storage capacity provided by the memory cell array(s) of the nonvolatile memory device 1100 by minimizing or reducing the size of designated bad areas. Exemplary operation of a bad block management unit will be described in some additional detail with reference to FIG. 3.

Figure 2:
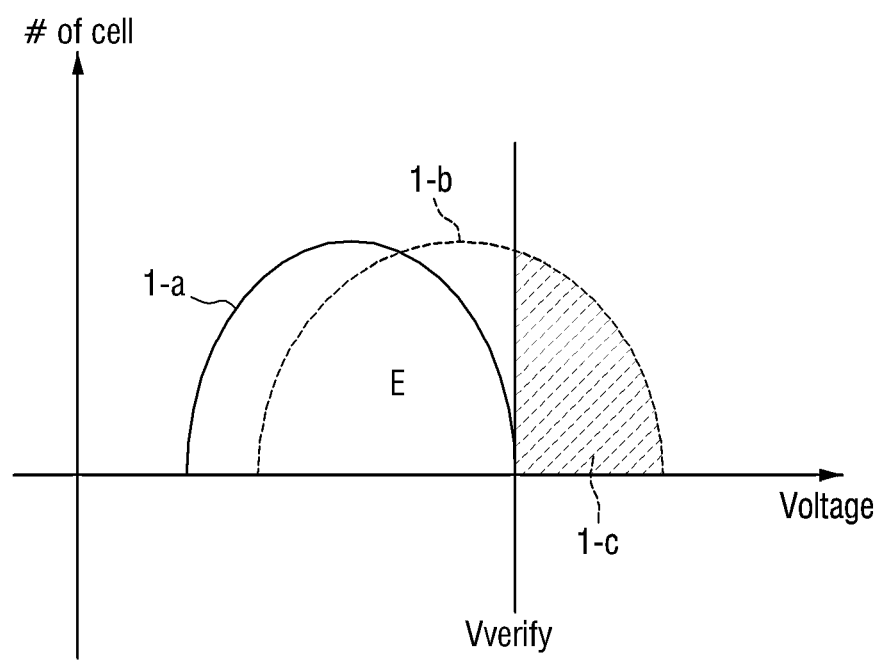
FIG. 2 is a graph illustrating a threshold voltage distribution that may be defined for a memory cells, such as the memory cells disposed in the nonvolatile memory device 1100 of FIG. 1, in an erased state.

FIG. 2 is a graph illustrating a threshold voltage distribution that may defined as an erase state for the memory cells of the nonvolatile memory device 1100 in FIG. 1.

Referring to FIG. 2, the 'x' axis indicates threshold voltage level, and the 'y' axis indicates a number of memory cells. A first erase state distribution 1-a is fully biased to the left (i.e., less than or greater than, depending on control voltage definitions) of an established erase verify voltage (Vverify), whereas a second erase state distribution 1-b partially extends (i.e., in distribution region 1-c) beyond the erase verify voltage. Thus, the first erase state distribution 1-a is a threshold voltage distribution range for memory cells that will not subsequently be interrupted as an "erase operation fail". That is, memory cells having a threshold voltage that falls with the first erase state distribution 1-a may reasonably be deemed to be normal memory cells. However, memory cell(s) having a threshold voltage, following a successfully performed erase operation, that fall outside first erase state distribution and therefore beyond the erase verifying voltage may reasonably be deemed to be erase fail memory cell(s). Hence, the second erase state distribution 1-b will necessarily include erase fail memory cells that may thereafter be designated as part of a corresponding bad area.

Figure 3:
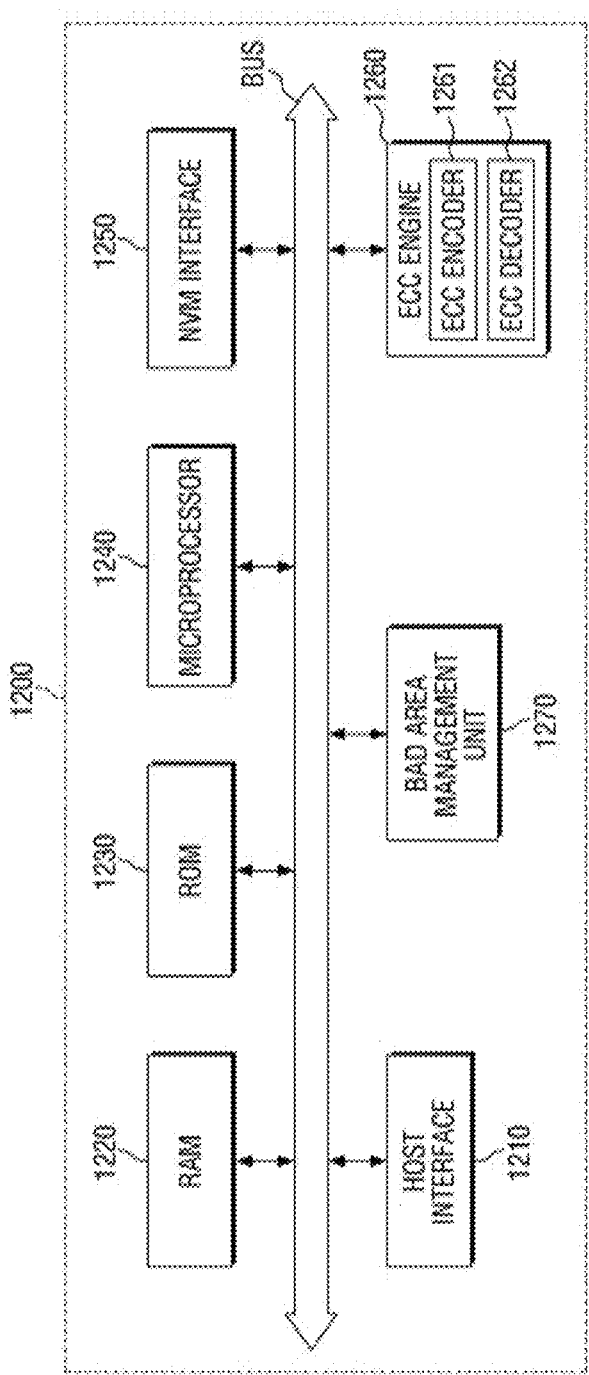
FIG. 3 is a block diagram further illustrating the memory controller 1200 of FIG. 1.

FIG. 3 is a block diagram further illustrating in one example the memory controller 1200 of FIG. 1. Here, the controller 1200 includes a microprocessor 1240, a read-only memory (ROM) 1230, a random access memory (RAM) 1220, a memory interface 1250, an error detection and correction (ECC) engine 1260, and a bad area management unit 1270 respectively interconnected via a bus.

As will be conventionally appreciated, the host interface 1210 provides one or more interface within the memory system 1000 between the memory controller 1200 and a host (not shown). For example, the host interface 1210 may communicate a logical address, a command latch enable (CLE) signal, an address latch enable (ALE) signal, a ready and busy (R/B) signal, a chip in-enable (CE) signal from the host to the memory controller 1200. In certain embodiments, the host interface 1210 may communicate with a host using one or more predetermined data communication protocol(s), such as a universal serial bus (USB), a small computer system interface (SCSI), a PCI express, an ATA, a parallel ATA (PATA), a serial ATA (SATA), and a serial attached SCSI (SAS).

The ROM 1230 may be used to store a driving firmware code for the memory system 1000. In certain embodiments, the firmware code may be stored, wholly or in part, in the nonvolatile memory device 1100 as well as the ROM 1230. Accordingly, the control operations performed by the microprocessor 1240 may be executed in accordance with the firmware stored in the ROM 1230 and/or nonvolatile memory device 1100.

The RAM 1220 may be used within the memory controller 120 as a buffer memory to temporarily store incoming/outgoing data as well as a received command/address information as received via the host interface 1210. Further, designated portions of the RAM 1220 may be operationally used as a "replacement area" for a corresponding bad area identified in the nonvolatile memory device 1100. In these various contexts, the RAM 1220 may be used to store "program data" to be programmed to the nonvolatile memory device 1100 during a program operation, and "read data" retrieved from the nonvolatile memory device 1100 during a read operation. The RAM 1220 may also be used to store various parameter values, variable values, etc.

The microprocessor 1240 may be variously configured using circuitry, logic circuitry, and/or enabling software code. However, configured the microprocessor 1240 will control the overall operation of the memory system 1000, including the memory controller 1200. When power is applied to the memory system 1000, the microprocessor 1240 may be used to control the boot-up of the memory system 1000. The microprocessor 1240 may be used to interpret command(s) received via the host interface 1210, and to thereafter control the operation of the nonvolatile memory device 1100 based on the interpretation results. The microprocessor 1240 may also be used to map a logical address provided from the host to a corresponding physical address of the nonvolatile memory device 1100 using one or more address mapping table(s).

The nonvolatile memory (NVM) interface 1250 may be used to exchange data/address/control information between the memory controller 1200 and the nonvolatile memory device 1100. Also, a command from the microprocessor 1240 may be communicated to the nonvolatile memory device 1100 via the memory interface 1250.

The ECC engine 1260 may be configured to perform one or more error detection and/or correction (ECC) routines on data being exchanged between the memory controller 1200 and the nonvolatile memory device 1100. The ECC engine of FIG. 3 includes separate ECC decoder 1262 and ECC encoder 1261, but those skilled in the art will recognize that many different ECC implementations may be used—including those run on microprocessor 1240 without the aid of separated, dedicated ECC circuitry. In the illustrated embodiment, the ECC encoder 1261 may be used to generate and add so-called "parity data" (one example of "ECC data" variously associated with program/read data in relation to an established ECC routine) by performing error correction encoding on program data to be programmed to the nonvolatile memory device 1100. Hence, parity data (or ECC data) may be stored together with the program data in the nonvolatile memory device 1100.

Thereafter, the ECC decoder 1262 may be used to perform error correction decoding on read data provided from the nonvolatile memory device 1100 using the corresponding parity data. Corrected (as needed) read data may then be communicated to the host via the memory controller 1200. The ECC encoder 1261 and ECC decoder 1262 may perform error correction using, but not limited to, low density parity check (LDPC) code, BCH code, turbo code, Reed-Solomon code, convolution code, recursive systematic code (RSC), or coded modulation such as trellis-coded modulation (TCM) or block coded modulation (BCM), etc.

The bad area management unit 1270 may be configured to selectively manage identified bad area(s) within the memory space provided by the nonvolatile memory device 1100. In certain embodiments of the inventive concept, the bad area management unit 1270 will be configured to initially erase a target memory block. Any competent erase operation, including both those conducted on a whole block basis or a sub-block basis, may be performed by the nonvolatile memory device 1100 under the control of the memory controller 1200.

Following successful execution of the erase operation, the bad area management unit 1270 will cause the nonvolatile memory device 1100 to perform an erase verifying operation. In this context, it may be said that the erase verifying operation is "immediately performed following the erase operation". Here, the erase verifying operation need not be immediately performed in a linear temporal sense, but must be performed on the target memory block before a next program operation or read operation is directed to the target memory block.

In the sequential execution of the erase operation and erase verifying operation on a target memory block, the bad area management unit 1270 may effectively execute of a bad memory cell search operation while performing the erase verifying operation. Recalling the discussion above had in relation to FIG. 2, each bad memory cell will be an erase fail memory cell having a threshold voltage (post-erase operation) in (e.g.,) the fail portion 1-*c* of the second erase state distribution 1-*b* illustrated in FIG. 2. Following identification of an erase fail memory cell, its correspondingly connected word line may be designated as a bad area, whereas all other word lines connected to only normal memory cells may be designated as good areas.

In this context, the bad area management unit 1270 may be configured to accurately determine the threshold voltage of each bad memory cell by reading the bad memory cell with a plurality of read voltages. In effect, the bad area management unit 1270 may be configured to compare the (post-erase operation) threshold voltage of a bad memory cell to one or more reference voltage(s) to obtain corresponding comparison results. According to the comparison results, the bad area management unit 1270 may thereafter be configured to selectively treat the word line connected to the bad memory cell (or an entire memory block including the bad memory cell) as a bad area. Reference voltage values may be adaptively determined during the operation of the memory controller 1200, or may be preset during manufacture of nonvolatile memory device 1100. However determined, relevant reference voltage values may be stored in ROM 1230 and/or nonvolatile memory device 1100.

When the threshold voltage of the bad memory cell is lower than a particular reference voltage, the bad area management unit 1270 may be configured to treat corresponding "bad word line" (and therefore all of the memory cells connected thereto) as a bad area. It is assumed in certain embodiments that a reference voltage may be set to a first reference voltage (e.g., 5V) and a second reference voltage (e.g., 7V) higher than the first reference voltage. Further assuming that the threshold voltage of a bad memory cell is 1V, the bad area management unit 1270 will treat the corresponding bad word line connected to the bad memory cell as part of a bad area. Accordingly, since the threshold voltage of the bad memory cell is lower than both the second and first reference voltages, the bad area management unit may treat the bad word line connected to the bad memory cell, and provide the bad word line with the same pass voltage provided to "good word lines" associated with good areas of the target memory block during program and read operations subsequently directed to the target memory block.

In contrast, when the threshold voltage (e.g., 6V) of the bad memory cell falls between the first and second reference voltages, the bad area management unit 1270 may be configured to treat the corresponding bad line differently and thereafter provide the bad word line with a voltage higher than the voltage provided to good word lines connected to only normal memory cells during program and read operation subsequently directed to the target memory block. When the threshold voltage of a bad memory cell is higher than the first reference voltage, the bad memory cell may not pass sufficient current to properly perform during program or read operations. This possibility may lead to failure of the program or read operation.

As a result, the bad area management unit 1270 will cause a higher voltage to be provided to the bad memory cell via its corresponding bad word line in an attempt to increase the current passed by the bad memory cell in order to improve performance of the bad memory cell during the program or read operation. In this regard, the foregoing reference voltage comparison operation may be said to identify an "impaired bad memory cell" (i.e., a bad memory cell having a (post-erase operation) threshold voltage between established upper and lower limits for a reference voltage.

Finally, within the context of the working example, when the threshold voltage of the bad memory cell is higher than the second reference voltage, the bad area management unit 1270 is configured to treat the entire target block including the bad memory cell as the bad area. This outcome may be attributed to the fact that the higher threshold voltage of bad memory cell fully precludes the bad memory cell from passing sufficient current during program or read operations to provide successful execution of the program or read operation. Thus, operational failure for the target block (in consideration of the existing ECC capabilities) may be determined and the corresponding memory block designated as a bad memory block.

Thus, the bad area management unit 1270 of FIG. 3 may be configured to treat a sub-block of the target memory block (i.e., a bad word line being connected to an impaired bad memory cell) as a bad area, or to treat the entire target block as a bad area based on an intelligent comparison of the threshold voltage of a bad memory cell to one or more reference voltages. In this manner, the bad area management unit 1270 need not discard an entire memory block as a bad area due to the presence of weak of impaired memory cells as opposed to fully "bad" memory cells. Such selective identification and classification of individual treatment of bad memory cells, enables a more efficient designation of bad areas within a memory cell array, thereby preserving more available memory space for use within the constituent memory system.

The bad area management unit 1270 may determine the threshold voltage of the bad cell memory by repeatedly reading the threshold voltage of a bad memory cell using a plurality of (read) verification voltages. Thereafter, the bad area management unit 1270 may be configured to execute program operations directed to the nonvolatile memory device 1100 in view of the identified and classified (e.g., impaired bad verses fully bad) bad memory cells.

Figure 4:
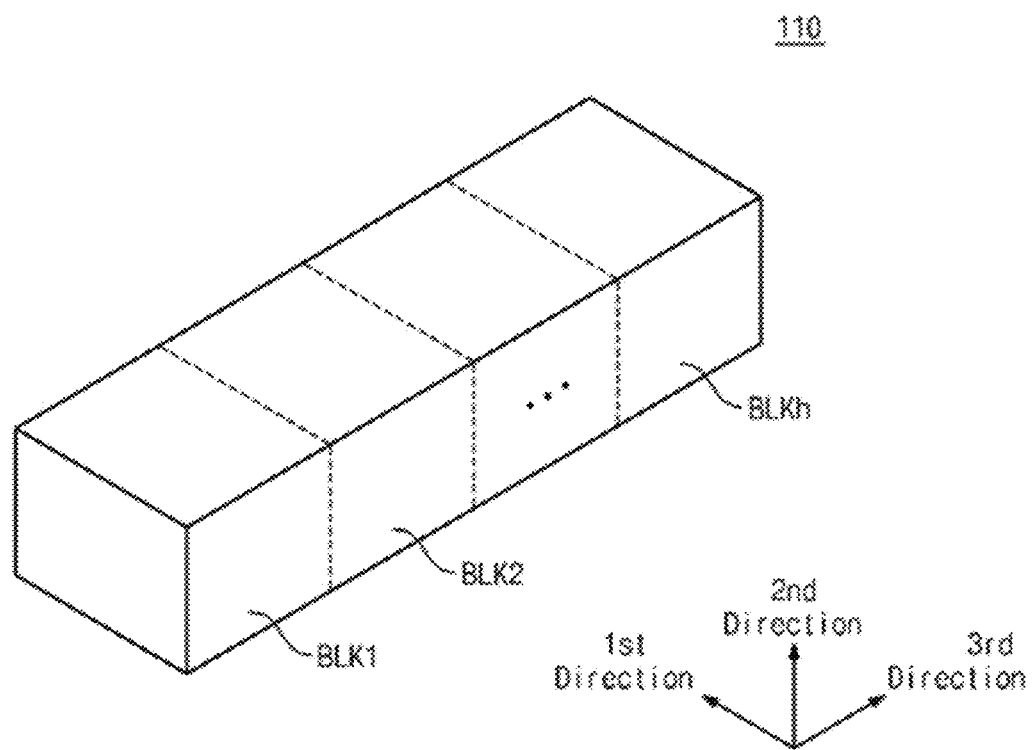
FIG. 4 is a conceptual diagram illustrating one possible arrangement for memory cells in the constituent memory cell array of the nonvolatile memory device 1100 of FIG. 1 according to certain embodiments of inventive concept.
Figure 5:
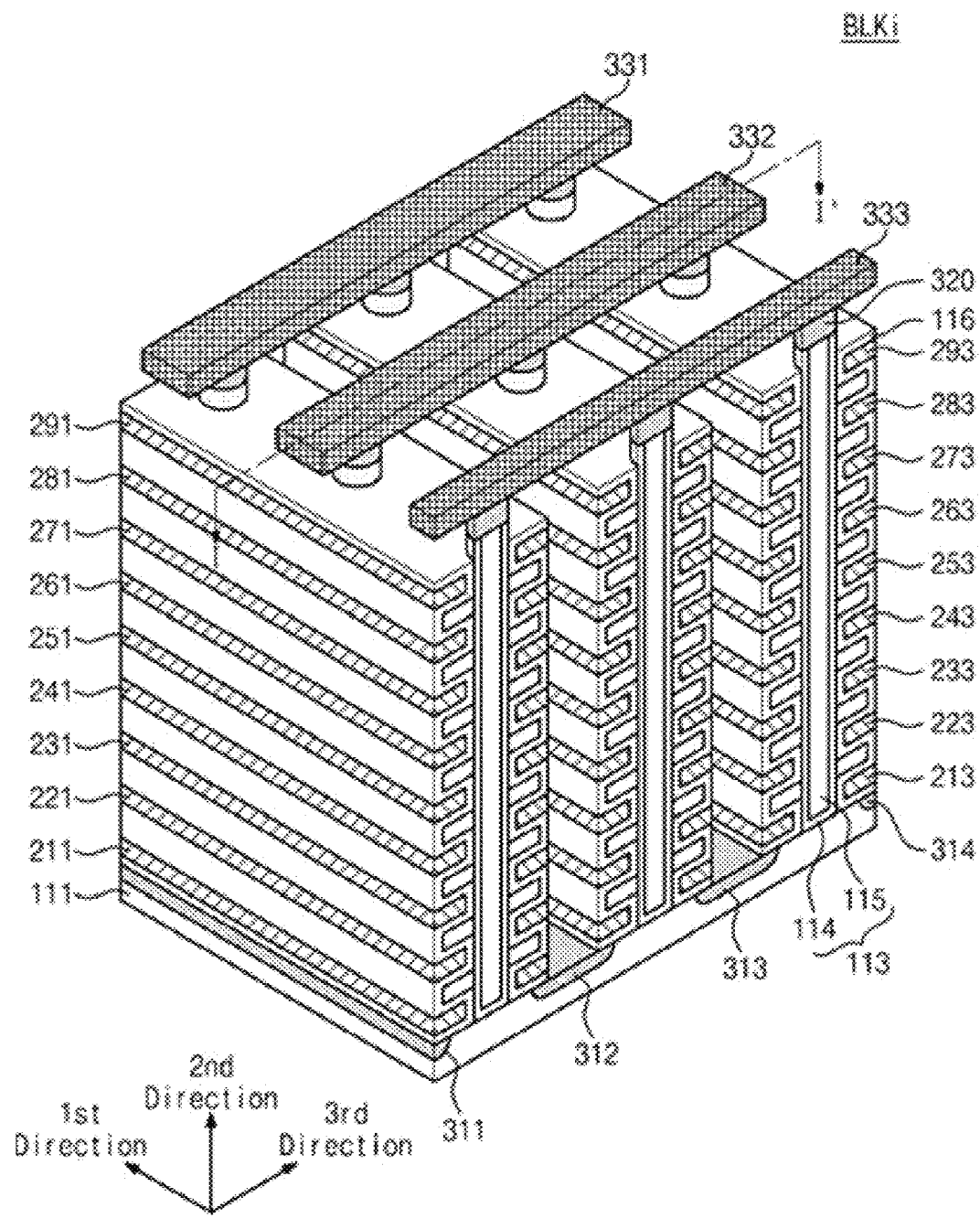
FIG. 5 is a perspective view further illustrating in one example a portion of the memory block 110 of FIG. 4.
Figure 6:
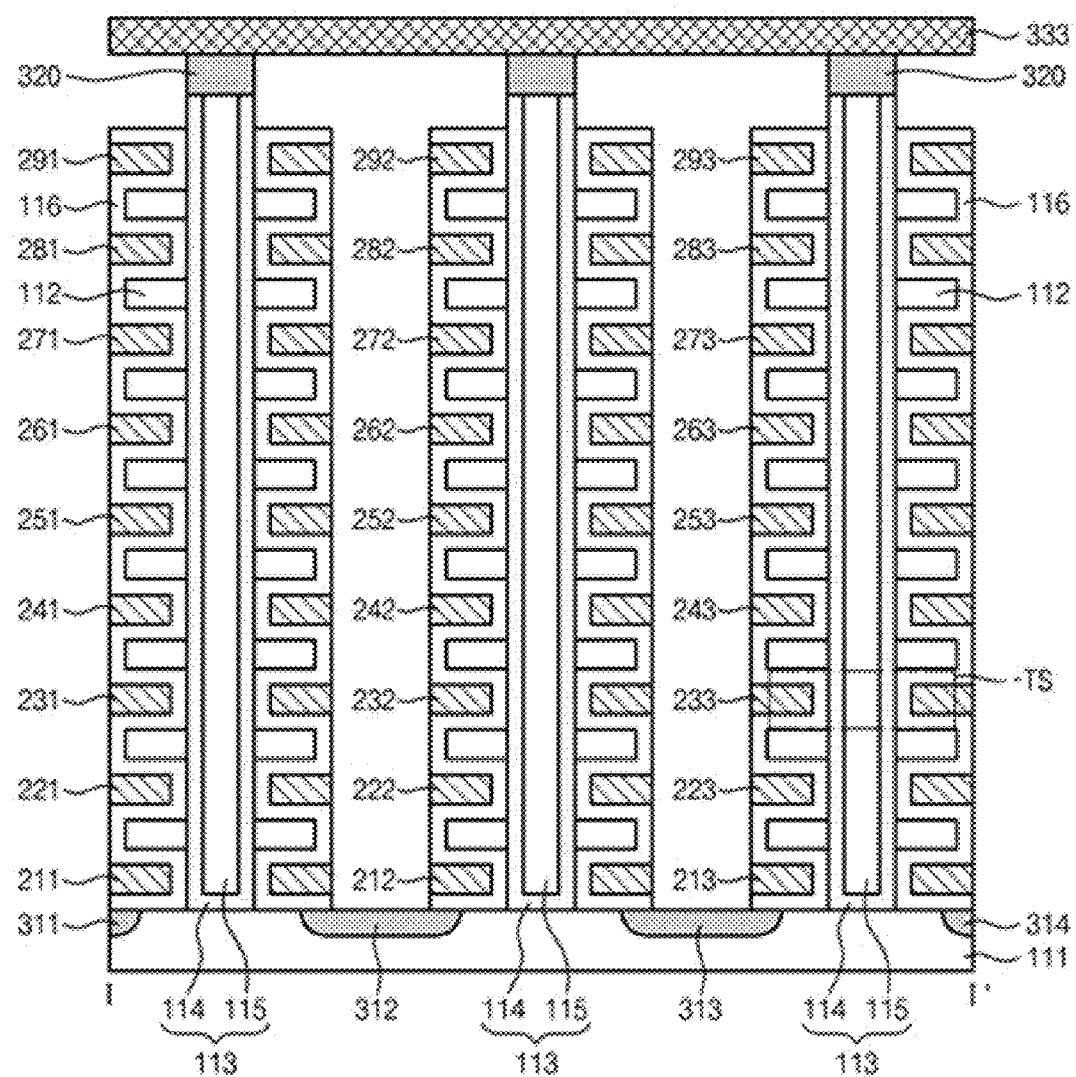
FIG. 6 is a cross-sectional view taken along a line I-I' of FIG. 5.

As shown in FIGS. 4, 5 and 6 hereafter, the nonvolatile memory device 1100 may in certain embodiments of the inventive concept be implemented in a 3D structure.

FIG. 4 is a diagram illustrating a portion of the memory cell array provided by the nonvolatile memory device 1100 of FIG. 2 according to certain embodiments of inventive concept. Referring to FIG. 4, a memory cell array includes a plurality of memory blocks BLK1 through BLKh, each of which is formed to have a three-dimensional structure (or, a vertical structure). For example, each of the memory blocks BLK1 through BLKh may include structures extending along first to third directions.

Each of the memory blocks BLK1 through BLKh may include a plurality of NAND strings extending along the second direction. For example, a plurality of NAND strings NS may be provided along the first and third directions. Each NAND string NS may be connected to a bit line, at least one string selection line, at least one ground selection line, word lines, and a common source line. That is, each memory block may be connected to a plurality of bit lines, a plurality of string selection lines, a plurality of ground selection lines, a plurality of dummy word lines, and a plurality of common source lines. Each memory block will be described in some additional detail with reference to FIGS. 5, 6 and 7.

FIG. 5 is a perspective view of a portion of a memory block of FIG. 4 according to certain embodiments of inventive concept, and FIG. 6 is a cross-sectional view taken along a line I-I' of FIG. 5. Referring to FIGS. 5 and 6, a memory block BLKi may include structures that extend along first to third directions.

First, a substrate 111 may be provided. In example embodiments, the substrate 111 may include a silicon material doped with a first-type impurity. For example, the substrate 111 may be a silicon material doped with a p-type impurity or a p-well (or, a pocket p-well), and may further include an n-well surrounding the p-well. Below, it is assumed that the substrate 111 is p-type silicon. However, the substrate 111 is not limited thereto.

A plurality of doping regions 311 through 314 extending along the first direction may be provided at the substrate 111. For example, a plurality of doping regions 311 through 314 (hereinafter, referred to first through fourth doping regions) may be an n-type. Hereinafter, it is assumed that the first through fourth doping regions 311 through 314 are an n-type. However, the first through fourth doping regions 311 through 314 are not limited thereto.

On the substrate 111 between the first and second doping regions 311 and 312, a plurality of insulating materials 112 extending along the first direction may be sequentially provided along the second direction. For example, the plurality of insulating materials 112 and the substrate 111 may be spaced apart along the second direction. For example, the plurality of insulating materials 112 may be formed to be separated by a desired (or alternatively predetermined) distance along the second direction. In example embodiments, the insulating materials 112 may include an insulating material such as silicon oxide.

On the substrate 111 between the first and second doping regions 311 and 312, a plurality of pillars 113 may be provided which are sequentially disposed along the first direction and pass through the insulating materials 112 along the second direction. In example embodiments, the pillars 113 may contact with the substrate 111 through the insulating materials 112, respectively.

In example embodiments, each of the pillars 113 may be formed of a plurality of materials. For example, a surface layer 114 of each pillar 113 may include a first-type silicon material. For example, the surface layer 114 of each pillar 113 may include a silicon material doped with the same type as the substrate 111. Hereinafter, it is assumed that the surface layer 114 of each pillar 113 includes p-type silicon. However, the surface layer 114 of each pillar 113 is not limited thereto.

An inner layer 115 of each pillar 113 may be formed of an insulating material. For example, the inner layer 115 of each pillar 113 may include an insulating material such as silicon oxide, but example embodiments of inventive concepts are not limited thereto.

Between the first and second doping regions 311 and 312, an insulating film 116 may be provided along exposed surfaces of the substrate 111, the insulating materials 112, and the pillars 113. For example, the thickness of the insulating film 116 may be less than half a distance between the insulating materials 112. That is, a region where a material other than the insulating materials 112 and the insulating film 116 is disposed may be provided between an insulating film 116 provided on a lower surface of a first insulating material among the insulating materials 112 and an insulating film 116 provided on an upper surface of a second insulating material and at the lower portion of the first insulating material.

Between the first and second doping regions 311 and 312, conductive materials 211 through 291 may be provided on an exposed surface of the insulating film 116. For example, a conductive material 211 extending along the first direction may be provided between the substrate 111 and the insulating material 112 adjacent to the substrate 111. In detail, the conductive material 211 extending along the first direction may be provided between the substrate 111 and the insulating film 116 at a lower surface of the insulating material adjacent to the substrate 111.

A conductive material extending along the first direction may be provided between an insulating film 116 on an upper surface of a specific insulating material of the insulating materials 112 and an insulating film 116 on a lower surface of an insulating material disposed at a top of the specific insulating material.

A plurality of conductive materials 221 through 281 extending along the first direction may be provided among the insulating materials 112. Further, a conductive material 291 extending along the first direction may be provided on the insulating materials 112. In example embodiments, the conductive materials 211 through 291 may be a metal material. For example, the conductive materials 211 through 291 may be a conductive material such as polysilicon.

The same structure as that on the first and second doping regions 311 and 312 may be provided between the second and third doping regions 312 and 313. Between the second and third doping regions 312 and 313, there may be provided the insulating materials 112 extending along the first direction, the pillars 113 sequentially disposed in the first direction and passing through the insulating materials 112 along the second direction, the insulating film 116 provided on exposed surfaces of the pillars 113 and the insulating materials 112, and the conductive materials 212 through 292 extending along the first direction.

The same structure as that on the first and second doping regions 311 and 312 may be provided between the third and fourth doping regions 313 and 314. Between the third and fourth doping regions 313 and 314, there may be provided the insulating materials 112 extending along the first direction, the pillars 113 sequentially disposed in the first direction and passing through the insulating materials 112 in the third direction, the insulating film 116 provided on the exposed surfaces of the insulating materials 112 and the pillars 113, and the first conductive materials 213 through 293 extending along the first direction.

Drains 320 may be provided on the pillars 113, respectively. In example embodiments, the drains 320 may include a second-type silicon material. For example, the drains 320 may be an n-type silicon material. Hereinafter, it is assumed that the drains 320 include an n-type silicon material. However, the drains 320 are not limited thereto. In example embodiments, a width of each drain 320 may be wider than that of a corresponding pillar 113. For example, each drain 320 may be provided on a corresponding pillar 113 to have a pad shape.

Conductive materials 331 through 333 extending along the third direction may be provided on the drains 320. The conductive materials 331 through 333 may be sequentially disposed along the first direction. The conductive materials 331 through 333 may be connected to the drains 320 of corresponding regions, respectively. In example embodiments, the drains 320 and the second conductive material 333 extending along the third direction may be connected through contact plugs. In example embodiments, the conductive materials 331 through 333 may be a metal material. For example, the conductive materials 331 through 333 may be a conductive material such as polysilicon.

In FIGS. 5 and 6, each pillar 113 may form a string together with an adjacent region of an insulating film 116 and an adjacent region among the conductive lines 211 through 291, 212 through 292, and 213 through 293 extending along the first direction. For example, each pillar 113 may form a NAND string NS together with an adjacent region of an insulating film 116 and an adjacent region among the conductive lines 211 through 291, 212 through 292, and 213 through 293 extending along the first direction. The NAND string NS may include a plurality of transistor structures TS.

A p-type silicon surface layer 114 of a pillar 113 may act as a body. The first sub-insulating film 117 may act as a tunneling insulating film. For example, the first sub-insulating film 117 adjacent to the pillar 113 may include a thermal oxide layer.

The second sub-insulating film 118 may act as a charge storage film. For example, the second sub-insulating film 118 may act as a charge trap layer. For example, the second sub-insulating film 118 may include a nitride layer or a metal oxide layer (e.g., an aluminum oxide layer, a hafnium oxide layer, or the like).

The third sub-insulating film 119 adjacent to a first conductive material 233 may act as a blocking insulating film. In example embodiments, the third sub-insulating film 119 adjacent to a conductive material 233 extending along a first direction may be a single layer or a multi-layer. The third sub-insulating film 119 may be a high dielectric layer (e.g., an aluminum oxide layer or a hafnium oxide layer) having a larger dielectric constant compared with the first and second sub-insulating films 117 and 118.

The conductive material 233 may serve as a gate (or a control gate). That is, the conductive material 233 serving as a gate (or a control gate), the third sub-insulating film 119 serving as the blocking insulating film, the second sub-insulating film 118 serving as the charge storage layer, the first sub-insulating film 117 serving as the tunneling insulation layer, and the p-type surface layer 114 serving as a body may form a transistor (or, a memory cell transistor structure). In example embodiments, the first through third sub-insulating films 117 through 119 may form oxide-nitride-oxide (ONO). Below, it is assumed that the p-type surface layer 114 of the pillar 113 serves as a second-direction body.

A memory block BLKi may include a plurality of pillars 113. That is, the memory block BLKi may include a plurality of NAND strings NS. In detail, the memory block BLKi may include a plurality of NAND strings NS extending along a second direction (or, a direction vertical to a substrate).

Each NAND string NS may include a plurality of transistor structures TS that are disposed along a second direction. At least one of the transistor structures TS of each NAND string NS may serve as a string selection transistor SST. At least one of the transistor structures TS of each NAND string NS may serve as a ground selection transistor GST.

Gates (or control gates) may correspond to conductive materials 211 through 291, 212 through 292, and 213 through 293 extending along a first direction. That is, the gates (or the control gates) may be extended in the first direction to form two selection lines (e.g., at least one string selection line SSL and at least one ground selection line GSL) and word lines extending along the first direction.

Conductive materials 331 through 333 extending in a third direction may be connected to one ends of the NAND strings NS, respectively. Conductive materials 331 through 333 may act as bit lines BL. In the memory block BLK1, one bit line may be connected with a plurality of NAND strings.

Second-type doping regions 311 through 314 extending in the first direction may be provided to other ends of the NAND strings NS, respectively. The second-type doping regions 311 through 314 may serve as common source lines CSL.

To sum up the above description, the memory block BLKi may include a plurality of NAND strings that extend in a direction (i.e., the second direction) vertical to the substrate 111, and may be a NAND flash memory block (e.g., a charge trap type) in which a plurality of NAND strings NS may be connected to one bit line BL.

FIGS. 4, 6 and 6 are described under an assumption that first conductive lines 211 through 291, 212 through 292, and 213 through 293 extend along the first direction and are formed in nine layers. However, embodiments of inventive concept are not limited thereto. For example, conductive lines may extend along the first direction and be provided in 8, 16, or any reasonable number of layers. That is, one NAND string may include 8, 16, etc., transistors.

FIGS. 5 and 6 are described under an assumption that three (3) NAND strings NS are connected to a bit line. However, embodiments of inventive concept are not limited thereto. In example embodiments, in a memory block BLKi, m NAND strings NS may be connected to a bit line BL. At this time, the number of conductive materials 211 through 291, 212 through 292, and 213 through 293 extending along the first direction and the number of common source lines 311 through 314 may be adjusted according to the number of NAND strings NS connected to a bit line BL.

FIGS. 5 and 6 were described under an assumption that three (3) NAND strings NS are connected to a conductive material extending along the first direction. However, embodiments of inventive concept are not limited thereto. For example, n NAND strings NS may be connected to a conductive material extending along the first direction. At this time, the number of bit lines 331 through 333 may be adjusted according to the number of NAND strings connected to a bit line extending along the first direction.

Figure 7:
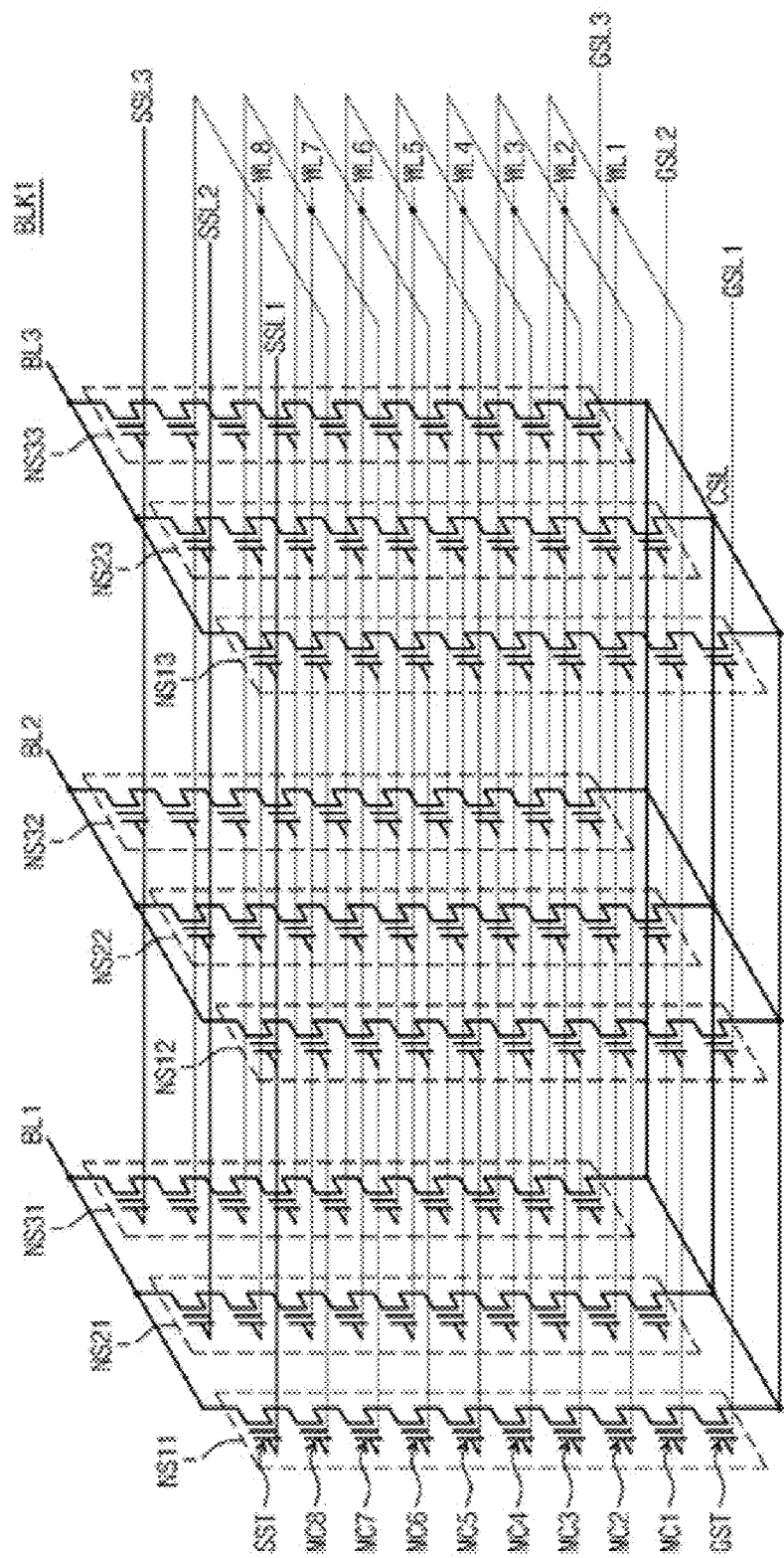
FIG. 7 is an equivalent circuit diagram for the memory block BLK1 described in FIGS. 4, 5 and 6.

FIG. 7 is an equivalent circuit diagram for the memory block described with reference to FIGS. 4, 5 and 6. Referring to FIGS. 4, 5, 6 and 7, NAND strings NS11, NS21, and NS31 may be provided between a first bit line BL1 and a common source line CSL. NAND strings NS12, NS22, and NS32 may be provided between a second bit line BL2 and the common source line CSL. NAND strings NS13, NS23, and NS33 may be provided between a third bit line BL3 and the common source line CSL. The first through third bit lines BL1 through BL3 may correspond to conductive material 331 through 333 extending in the third direction, respectively.

A string selection transistor SST of each NAND string NS may be connected to a corresponding bit line BL. A ground selection transistor GST of each NAND string NS may be connected to the common source line CSL. In each NAND string NS, memory cells MC may be provided between the string selection transistor SST and the ground selection transistor GST.

Below, NAND strings NS may be defined by the row and by the column. The NAND strings NS connected to one bit line in common may form one column. For example, the NAND strings NS11 through NS31 connected to the first bit line BL1 may correspond to a first column. The NAND strings NS12 through NS32 connected to the second bit line BL2 may correspond to a second column. The NAND strings NS13 through NS33 connected to the third bit line BL3 may correspond to a third column. The NAND strings NS connected to one string selection line SSL may form one row. For example, the NAND strings NS11 through NS13 connected to a first string selection line SSL1 may form a first row. The NAND strings NS21 through NS23 connected to a second string selection line SSL2 may form a second row. The NAND strings NS31 through NS33 connected to a third string selection line SSL3 may form a third row.

In each NAND string NS, a height may be defined. In example embodiments, in each NAND string NS, a memory cell MC1 adjacent to the ground selection transistor GST may be defined to have a height of 1. In each NAND string NS, a height of a memory cell may increase in inverse proportion to a distance from a string selection transistor SST. In each NAND string NS, a memory cell MC7 adjacent to the string selection transistor SST may be defined to have a height of 7.

NAND strings in the same row may share the string selection line SSL. NAND strings in different rows may be connected to different string selection lines SSL1, SSL2, and SSL3, respectively.

In each NAND string NS in the same row, memory cells having the same height may share a word line WL. At the same height, word lines WL connected to memory cells of NAND strings in different rows may be connected in common. The word line WL may be configured to be the memory cell layer. The block includes a plurality of memory cell layers stacked on a substrate and are electrically connected with other word lines Thus, treating the word line connected to the bad memory cell as the bad area may be treating the memory cell layer including the bad memory cell as the bad area.

In the same row of NAND strings NS, ground selection transistors GST may share a ground selection line GSL. In different rows of NAND strings NS, ground selection transistors GST may share the ground selection line GSL. That is, the NAND strings NS11 through NS13, NS21 through NS23, and NS31 through NS33 may be connected in common to the ground selection line GSL.

The common source line CSL may be connected in common to NAND strings NS. For example, first through fourth doping regions 311 through 314 may be interconnected at an active region of a substrate 111. For example, the first through fourth doping regions 311 through 314 may be connected to an upper layer via contacts. The first through fourth doping regions 311 through 314 may be connected in common at the upper layer.

As illustrated in FIG. 7, word lines placed at the same height may be connected in common. Thus, when a word line placed at a specific height is selected and all NAND strings connected with the selected word line may be selected. NAND strings in different rows may be connected to different string selection lines. Thus, NAND strings in an unselected row from among NAND strings connected with the same word line may be separated from a corresponding bit line by selecting the string selection lines SSL1 through SSL3. That is, a row of NAND strings may be selected by selecting and unselecting the string selection lines SSL1 through SSL3. A column of NAND strings in a selected row may be selected by selecting bit lines BL1 through BL3.

Still referring collectively to FIGS. 2, 3, 4, 5, 6 and 7, the bad area management unit 1270 may be used to select a first word line WL1 connected to a first memory cell MC1 that is a bad memory cell, and determine the threshold voltage of the first memory cell MC1. Here, it is assumed that the threshold voltage of the first memory cell is higher than a first reference voltage, and therefore the first word line WL1 is provided with the same pass voltage level as a (good) second word line WL2. Under such conditions, the first memory cell MC1 may not pass sufficient current for proper program/read operation and may instead cause a fail operation for the memory cells within string NS11.

Now, assuming separate first and second reference voltages are used, when the threshold voltage of the first memory cell MC1 is higher than the first reference voltage but lower than the second reference voltages, the first word line WL1 will be provided with a higher pass voltage than the pass voltage provided by the second word line WL2. This allows the first memory cell MC1 to pass greater current during subsequent program/read operations.

Figure 8:
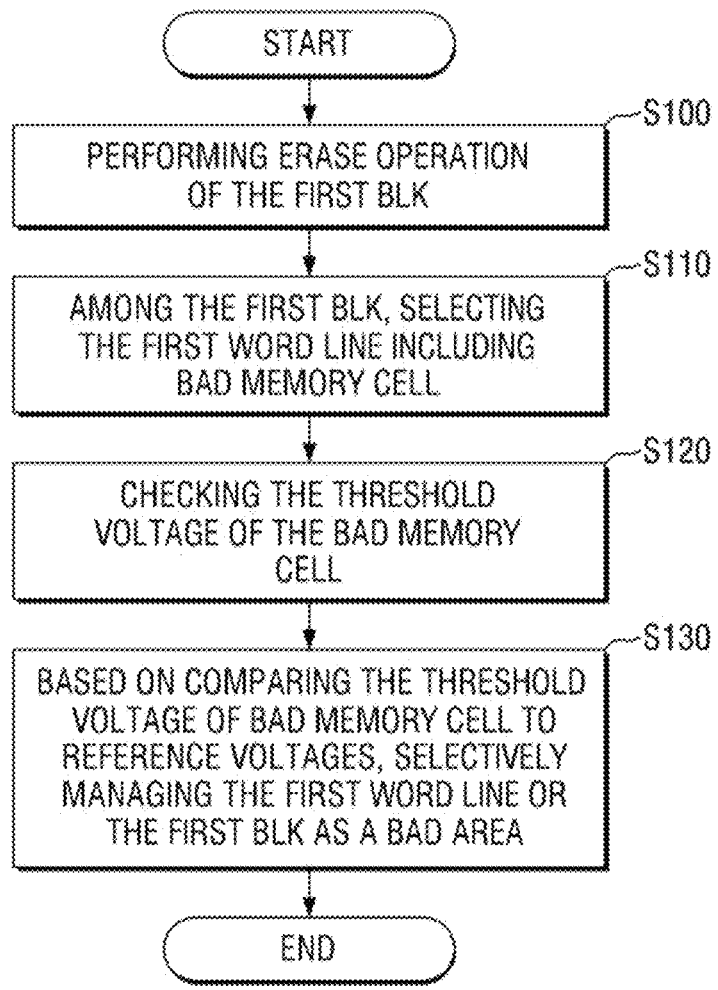
FIG. 8 is a general flowchart summarizing a method of operating a memory controller according to certain embodiments of the inventive concept.

FIG. 8 is a flowchart illustrating a method of operating a memory controller according to an embodiment of the inventive concept. More specifically, FIG. 8 summarizes an operating method including bad area management operation that may be performed by memory controllers consistent with embodiments of the inventive concept.

Referring to FIG. 8, a bad management unit erases at least a target (first) block of the nonvolatile memory device 1100 on a block basis (S100). That is, the bad management unit may be used to cause execution of the target block within nonvolatile memory device 1100. Then, the bad management unit will select a first word line connected to a bad memory cell within the target block (S110). For example, the bad management unit may search for (or differentiate) the bad memory cell from normal memory cells by performing an erase verifying operation on the target block following execution of the erase operation. Now, the bad management unit may be used to determine the relative level of the threshold voltage of the bad memory cell by repeatedly reading the bad memory cell using different read voltages (S120). For example, the bad management unit may compare the threshold voltage of the bad memory cell to a first reference voltage, a second reference voltage different from the first reference voltage, a third reference voltage different from the first and second reference voltages, etc. According to the generated comparison results, the bad management unit may be used to selectively treat only the first word line and its connected memory cell, or the entire target memory block as a bad area (S130). In this manner, the bad management unit may effectively manage the size and performance definition of the bad area.

Figure 9:
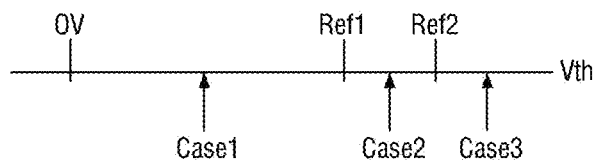
FIG. 9 is a voltage graph illustrating certain relationships between the threshold voltage of an identified bad memory cell and established reference voltages according to embodiments of the inventive concept.

FIG. 9 is a graph illustrating a set of relationships between the threshold voltage of bad memory cell and various reference voltages according to certain embodiments of the inventive concept. In FIG. 9, the 'x' axis indicates threshold voltage level.

Referring to FIG. 9, a first reference voltage Ref1 and the second reference voltage Ref2 are shown, wherein the second reference voltage is higher than the first reference voltage. It is assumed in the illustrated example that a 0V erase verifying voltage is used. However, an erase verifying voltage having a negative level or positive voltage might alternately be used.

FIG. 9 assumes a first case wherein the threshold voltage of bad memory cell is higher than 0 volt and lower than a first reference voltage; a second case wherein the threshold voltage of the bad memory cell is higher than the first reference voltage and lower than a second reference voltage; and a third case wherein the threshold voltage of the bad memory cell is higher than the second reference voltage.

Referring collectively to FIGS. 2, 3, 4, 5, 6, 7, 8 and 9, in the first case, the bad word line connected to the non-impaired bad memory cell (or memory cell layer including the bad memory cell) may be treated as a non-impaired bad area. That is, the bad memory cells corresponding to the first case may be assumed to yet be able to pass sufficient current for normal memory cell operation during program or read operations. Accordingly, the non-impaired bad memory cells corresponding to the first case may be provided with a "nominal pass voltage" nominally established for use during program or read operations of the memory system assuming "normal" memory cell performance. That is, the nominal pass voltage may be a voltage that is provided to normal memory cells as defined by nominal performance specifications provide by (e.g.,) the manufacturer of the nonvolatile memory device or memory controller.

However, in the second case, the bad word line connected to the bad memory cell (or memory cell layer including the bad memory cell) may be treated as an impaired bad area. That is, the bad memory cell of the second case may flow insufficient current in relation to the nominal pass voltage to ensure proper read or program operation performance. Thus, the impaired bad memory cell must be provided with an "elevated pass voltage" higher than the nominal pass voltage usually provided to normal memory cells.

Finally, in the third case, the entire memory block including the bad memory cell must be treated as a fully bad area. This is, due to the fact that the bad memory cell—possibly disposed in a 3D nonvolatile memory devices—will probably not pass sufficient current as indicated by the threshold voltage of the bad memory cell being higher than the second reference voltage. Thus, a NAND string including a fully bad memory cell may very well fail during a read or program operation.

Thus, in the context of the foregoing embodiments, it may be seen that a bad area management unit of a memory controller may be used to selectively define and account for a "bad area" of memory space according to an evaluation of bad memory cells type (e.g., non-impaired, impaired and fully bad). Thereafter, the entire memory block or merely a portion of the memory block (sub-block) may be designated as a bad area and subsequent read/program operations may be executed in view of same.

Figure 10A:
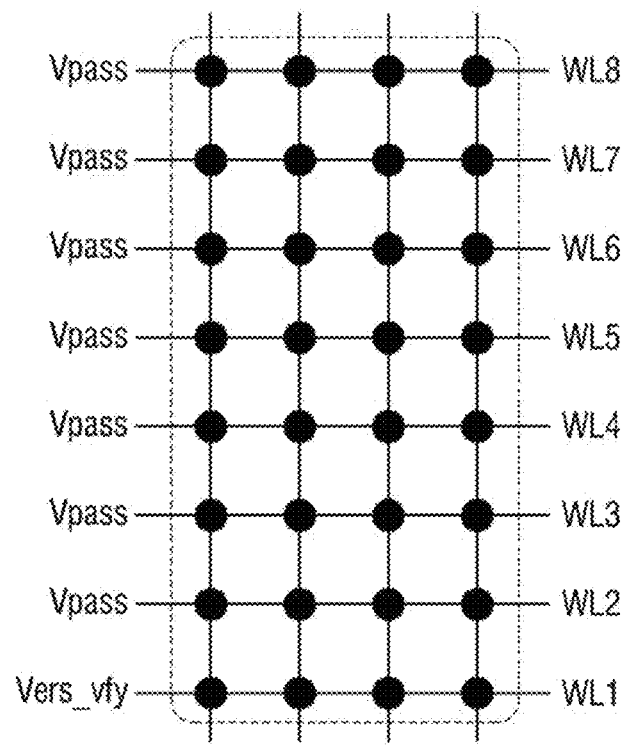
FIG. 10, inclusive of FIGS. 10A, 10B and 10C, is a conceptual diagram illustrating a method of searching for a bad memory cell according to embodiments of the inventive concept.
Figure 10B:
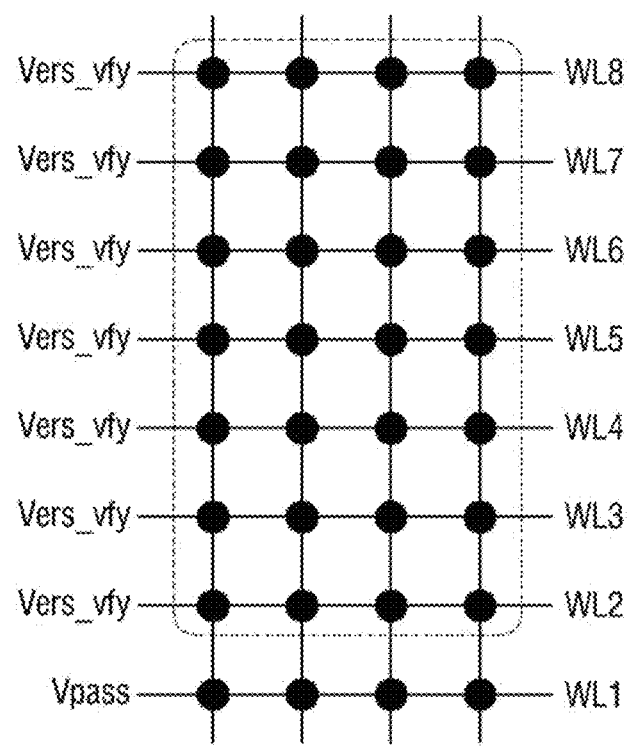
Figure 10C:
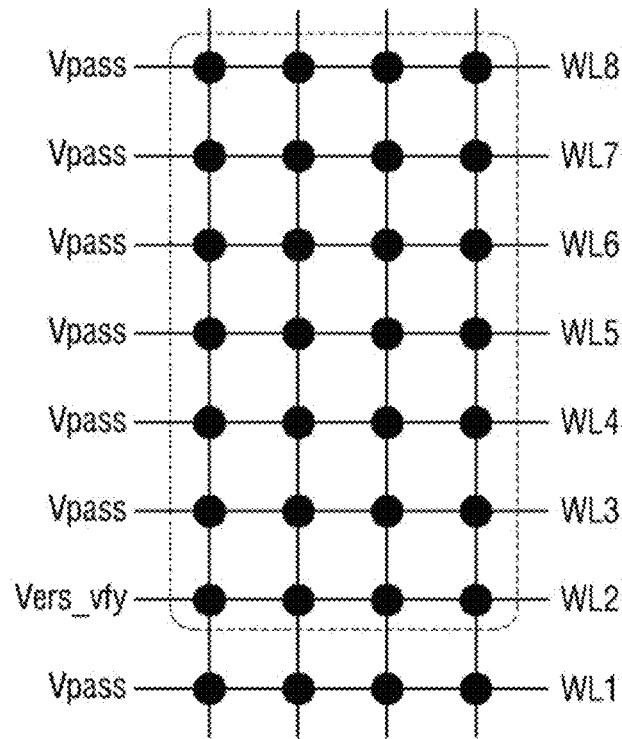

FIG. 10, inclusive of FIGS. 10A, 10B and 10C, is a conceptual diagram illustrating one method of searching for bad memory cell according to embodiments of the inventive concept. Here, FIGS. 10A, 10B and 10C illustrate an exemplary nonvolatile memory block including at least 8 word lines (WL1 through WL8).

Referring FIG. 10 in the context of the foregoing embodiments, the bad area management unit 1270 may be configured to search for one or more bad memory cell(s). Referring to FIG. 10A, the bad area management unit 1270 may search for the bad memory cell by sequentially performing an erase verifying operation of the word lines. Thus, the bad area management unit 1270 may first provide the first word line WL1 with the erase verify voltage (Vers_vfy) and let the bad management unit perform the erase verifying operation. When the erase verifying operation of the first word line WL1 fails, the bad area management unit 1270 may then perform the erase verifying operation for other word lines WL2 through WL8 in order to check the bad memory cells within other word lines WL2 through WL8.

Referring to FIG. 10B, the first word line WL1 is provided with pass voltage and the second word line WL2 through the eighth word line WL8 is provided with erase verify voltage. The bad area management unit 1270 may search for the bad memory cells within the second word line WL2 through the eighth word line WL8.

Referring now to FIG. 10A, when the first word line does not include bad memory cells, second word line WL2 through the eighth word line WL8 is sequentially provided with erase verify voltage, or when the first word line includes the bad memory cell, the bad area management unit 1270 may stop searching for bad memory cells.

Referring to FIG. 10C, the first word line does not include the bad memory cell and is provided with pass voltage. A second word line adjacent to the first word line is provided with erase verify voltage and the erase verifying operation is performed. Then, the third word line through the eighth word line are provided with pass voltage. Of note, the word line of a 3D nonvolatile memory device may be a memory cell layer. In either event, the bad area management unit 1270 may be used to perform the erase verifying operation on word line or memory cell layer which is most likely to fail the operation based on a result of ECC decoding.

Figure 11A:
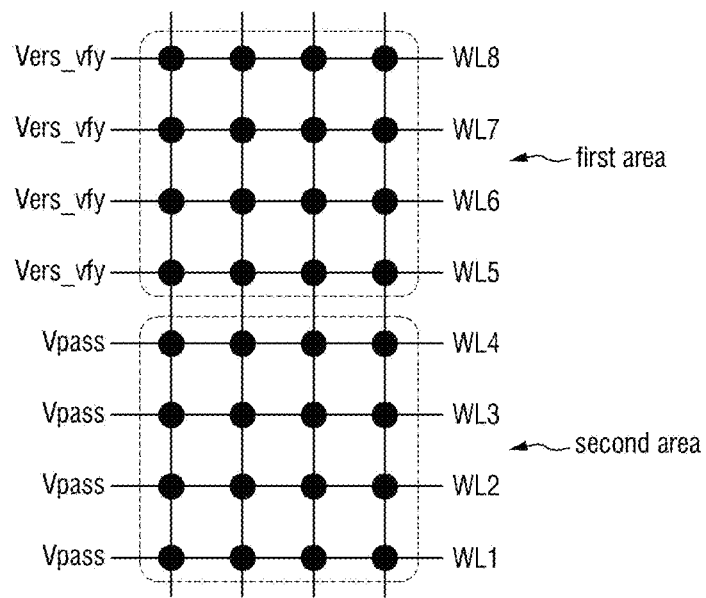
FIG. 11, inclusive of FIGS. 11A, 11B and 11C, is another conceptual diagram illustrating a method of searching for a bad memory cell according to other embodiments of the inventive concept.
Figure 11B:
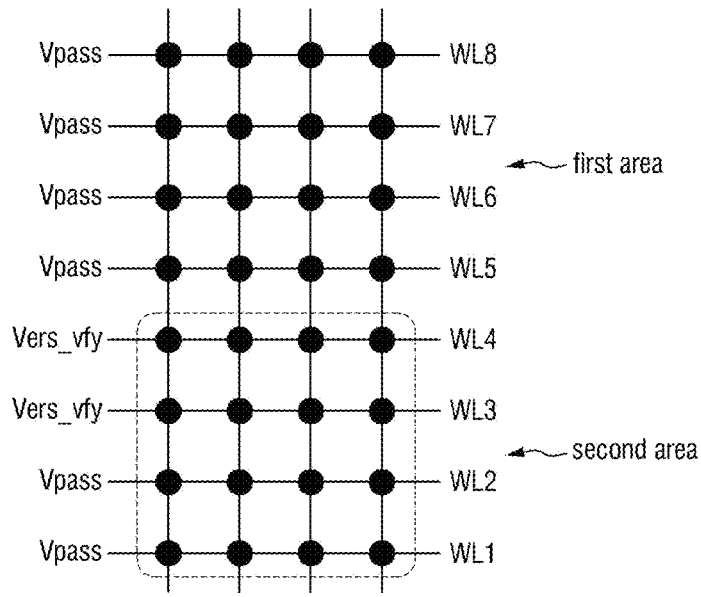
Figure 11C:
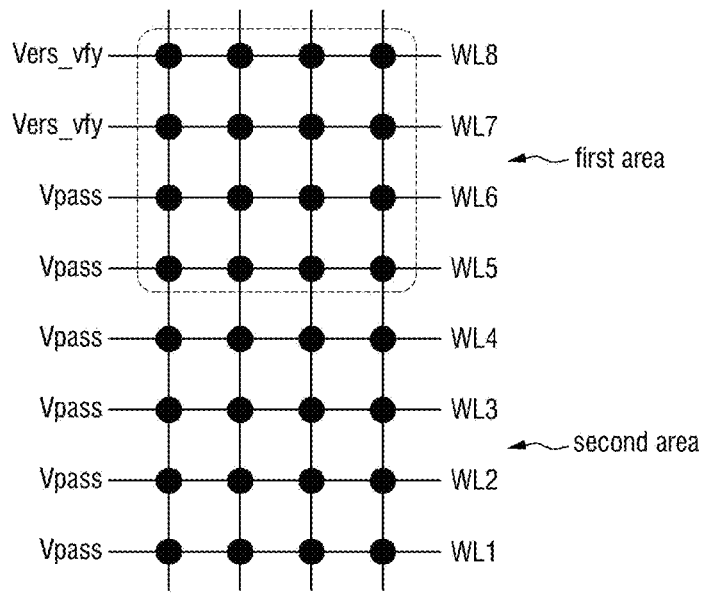

FIG. 11, inclusive of FIGS. 11A, 11B and 11C, is a conceptual diagram illustrating a method of searching a bad memory cell according to other embodiments of the inventive concept.

Referring to 11A, 11B and 11C, the bad area management unit 1270 may again be used to effectively divide word lines disposed on the substrate within a target block into a plurality of word line groups. The bad area management unit 1270 may thus search for one or more bad memory cells by performing an erase verifying operation on a word line group basis.

Hence, the bad area management unit 1270 may be configured to classify an area most likely to fail (hereafter, the "suspect area") the previously performed erase operation within a target block in view of corresponding ECC decoding results. Thereafter, the bad area management unit 1270 may perform the erase verifying operation on the suspect area.

Referring to FIG. 11A, a first word line group (first word line through the forth word line) is provided with the pass voltage while a second word line group (fifth word line through the eighth word line) is provided with the erase verifying voltage. Here, the bad area management unit 1270 performs the erase verifying operation on the plurality of word lines in the second word line group in the process of searching for the bad memory cell.

Referring FIG. 11B, the third and fourth word lines in the first word line group are provided with the erase verifying voltage, while the first and second word lines in the first word line group are provided with pass voltage. Here, the bad area management unit 1270 searches for the bad memory cell in the third and fourth word lines.

Referring to FIGS. 11A, 11B and 11C, the bad area management unit 1270 may be variously configured to search for one or more bad memory cells on a word line basis or a grouped word line basis.

Figure 12:
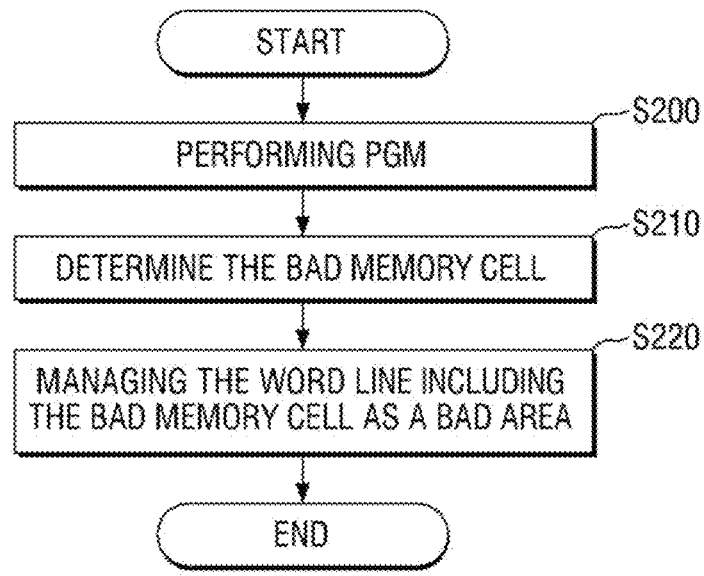
FIG. 12 is a general flowchart summarizing a method of operating a memory controller according to embodiments of the inventive concept.

FIG. 12 is a general flowchart summarizing a method of operating a memory controller according to embodiments of the inventive concept.

Referring to FIG. 1 and FIG. 12, the nonvolatile memory device 1100 performs a program operation (S200) that may be used to determine the presence of one or more bad memory cell(s), particularly (e.g.,) in view of the program verifying operation (S210) executed by the nonvolatile memory device 1100. A word line (or word lien group) associated with the bad memory cell may thereafter be treated as a bad area (S220). The bad memory cell may be a program fail memory cell having a lower threshold voltage than a target verify voltage. Thus, the bad area management unit 1270 may be configured to treat the word line (or word line group) associated with the bad memory cell without comparing with a reference voltage. Furthermore, the bad area management unit 1270 may be configured to determine the level of the threshold voltage of the bad memory cell, and treat an word line adjacent to a bad word line connected to the bad memory cell as part of the designated bad area based on the threshold voltage value.

Figure 13:
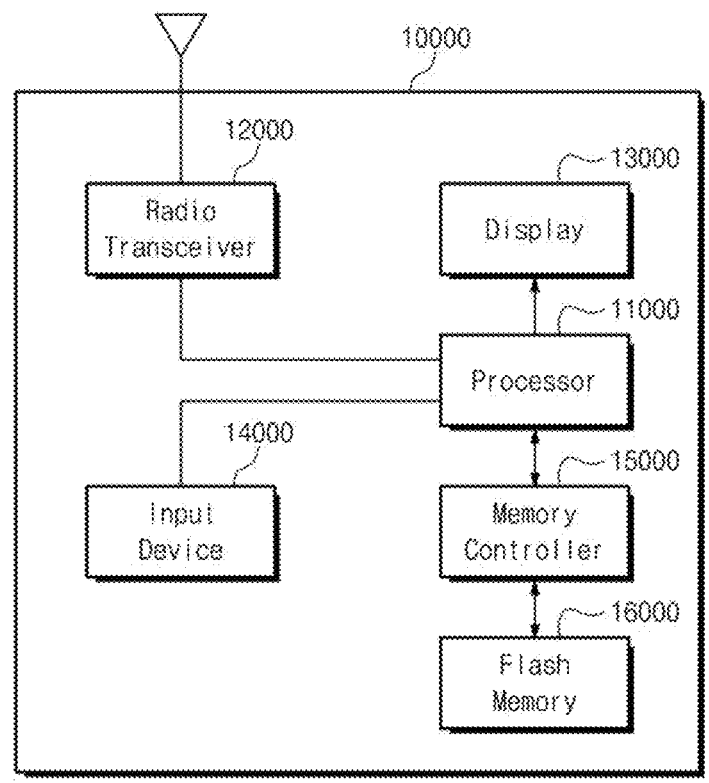
FIGS. 13, 14, 15, 16, 17 and 18 are respective block diagrams that variously illustrate electronic devices that may incorporate a memory system and/or a memory controller that is operated in accordance with an embodiment of inventive concept.

FIG. 13 is a block diagram illustrating an electronic device 10000 including a nonvolatile memory device according to embodiments of the inventive concept.

Referring to FIG. 13, the electronic device 10000 such as a cellular phone, a smart phone, or a tablet PC may include a nonvolatile memory device 16000 formed of a flash memory device and a memory controller 15000 controlling an operation of the nonvolatile memory device 16000.

The nonvolatile memory device 16000 may correspond to a nonvolatile memory device described in relation to FIGS. 1 and 2. The nonvolatile memory device 16000 may be configured to verify programming of first data pattern using a first memory cell storing the first data pattern, a second memory cell programmed using a program voltage, and a verification voltage corresponding to the first data pattern. When a verification result of the first memory cell indicates a pass, programming of the second memory cell may be ended.

The memory controller 15000 may correspond to a memory controller illustrated in FIG. 1. The memory controller 15000 may be controlled by a processor 11000 controlling an overall operation of the electronic device 10000.

Data stored in the nonvolatile memory device 16000 may be displayed via a display 13000 under the control of the memory controller 15000 that operates in response to the control of a processor 11000.

A radio transceiver 12000 may transmit and receive a radio signal via an antenna. For example, the radio transceiver 12000 may convert a radio signal received via the antenna to a signal suitable for the processor 11000 to process. The processor 11000 may process a signal output from the radio transceiver 12000, and the processed signal may be stored in the nonvolatile memory device 16000 via the memory controller 15000 or displayed via the display 13000.

The radio transceiver 12000 may convert a signal from the processor 11000 to a radio signal to output it to an external device via the antenna.

An input device 14000 may be a device capable of receiving a control signal for controlling an operation of the processor 11000 or data to be processed by the processor 11000. The input device 14000 may include a pointing device such as a touch pad or a computer mouse, a keypad, or a keyboard.

The processor 11000 may control the display 13000 so as to display data output from the nonvolatile memory device 16000, a radio signal from the radio transceiver 12000, or data from the input device 14000.

Figure 14:
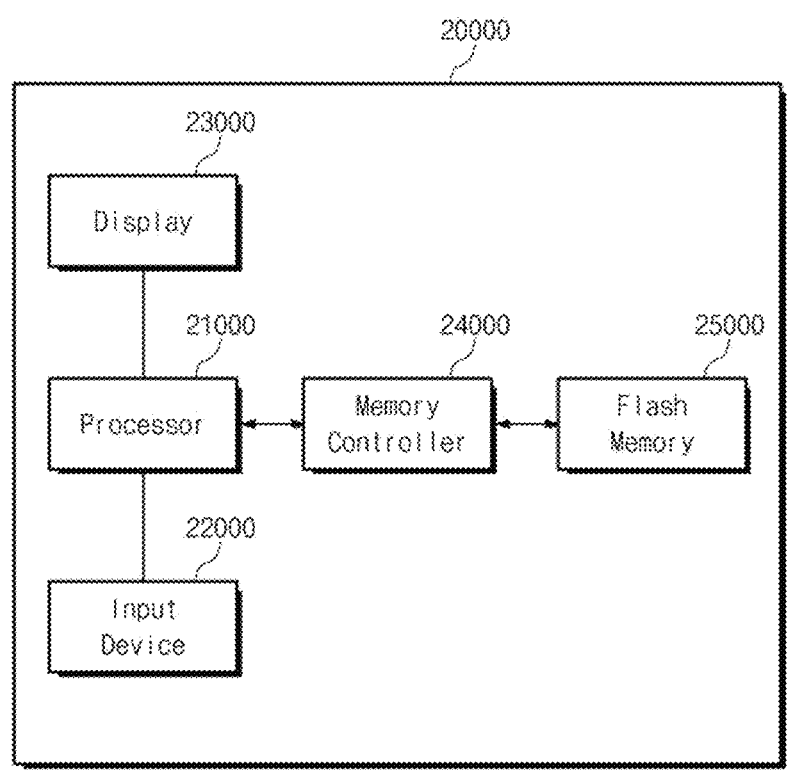

FIG. 14 is a block diagram illustrating an electronic device 20000 including a memory controller and a nonvolatile memory device according to embodiments of the inventive concept.

Referring to FIG. 14, an electronic device 20000 may be a data processing device such as a personal computer, a tablet computer, a net-book, an e-reader, a PDA, a PMP, an MP3 player, or an MP4 player, and may include a nonvolatile memory device 25000 such as a flash memory device and a memory controller 24000 controlling an operation of the nonvolatile memory device 25000.

The nonvolatile memory device 25000 may correspond to a nonvolatile memory device described in relation to FIGS. 1 and 2. The nonvolatile memory device 25000 may be configured to verify programming of first data pattern using a first memory cell storing the first data pattern, a second memory cell programmed using a program voltage, and a verification voltage corresponding to the first data pattern. When a verification result of the first memory cell indicates a pass, programming of the second memory cell may be ended.

The memory controller 24000 may correspond to a memory controller illustrated in FIG. 1. The electronic device 20000 may include a processor 21000 controlling an overall operation of the electronic device 20000. The memory controller 24000 may be controlled by the processor 21000.

The processor 21000 may display data, stored in a nonvolatile memory device, via a display according to an input signal generated by an input device 22000. For example, the input device 22000 may be formed of a pointing device such as a touch pad or a computer mouse, a keypad, or a keyboard.

Figure 15:
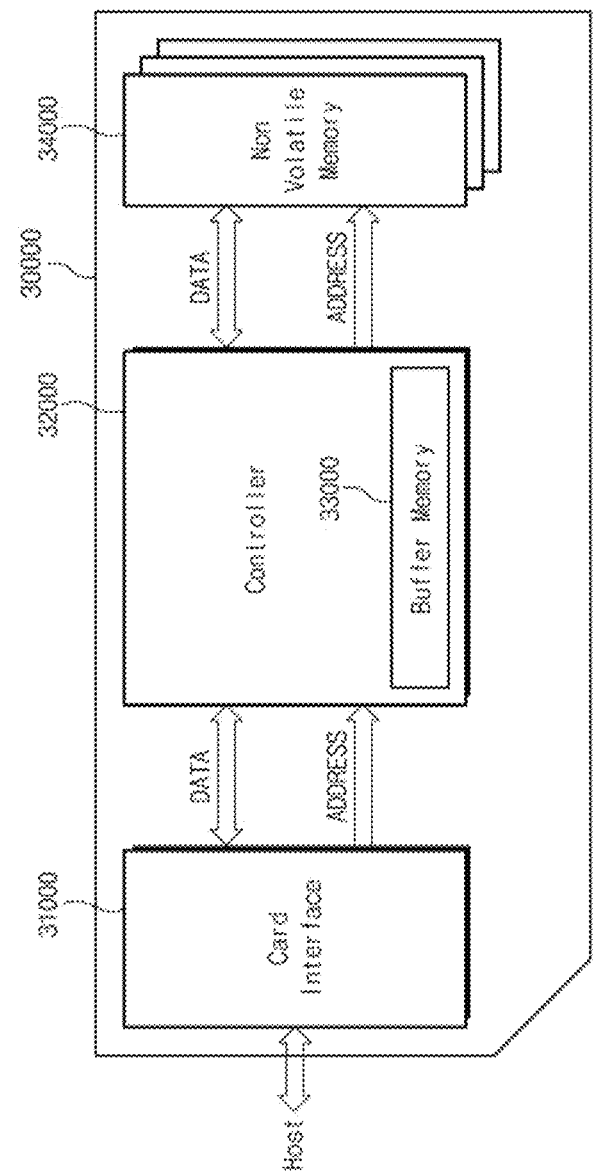

FIG. 15 is a block diagram illustrating an electronic device including a nonvolatile memory device according to embodiments of the inventive concept. Referring to FIG. 15, an electronic device 30000 may include a card interface 31000, a memory controller 32000, and at least one nonvolatile memory device 34000, for example, a flash memory device.

The electronic device 30000 may exchange data with a host via card interface 31000. In example embodiments, the card interface 31000 may be an SD card interface or an MMC interface. However, example embodiments of inventive concepts are not limited thereto. The card interface 31000 may exchange data between the host and the memory controller 32000 according to the communication protocol of the host capable of communicating with the electronic device 30000.

The memory controller 32000 may control an overall operation of the electronic device 30000, and may control data exchange between the card interface 31000 and the nonvolatile memory device 34000. A buffer memory 33000 of the memory controller 32000 may buffer data transferred between the card interface 31000 and the at least one nonvolatile memory device 34000.

The memory controller 32000 may be connected to the card interface 31000 and the nonvolatile memory device 34000 via a data bus and an address bus. In example embodiments, the memory controller 32000 may receive an address of data to be read or written via the address bus from the card interface 31000 to send it to the at least one nonvolatile memory device 34000.

The memory controller 32000 may receive or send data to be read or to be written via the data bus connected to the card interface 31000 or the at least one nonvolatile memory device 34000.

The at least one nonvolatile memory device 34000 may correspond to a nonvolatile memory device described in relation to FIGS. 1 and 2. The at least one nonvolatile memory device 34000 may be configured to verify programming of first data pattern using a first memory cell storing the first data pattern, a second memory cell programmed using a program voltage, and a verification voltage corresponding to the first data pattern. When a verification result of the first memory cell indicates a pass, programming of the second memory cell may be ended. The memory controller 32000 may correspond to a memory controller illustrated in FIG. 1.

When the electronic device 30000 in FIG. 15 is connected to a host such as a PC, a tablet PC, a digital camera, a digital audio player, a cellular phone, a console video game hardware, or a digital set-top box, the host may send or receive data stored in the nonvolatile memory device 34000 via the card interface 31000 and the memory controller 32000.

Figure 16:
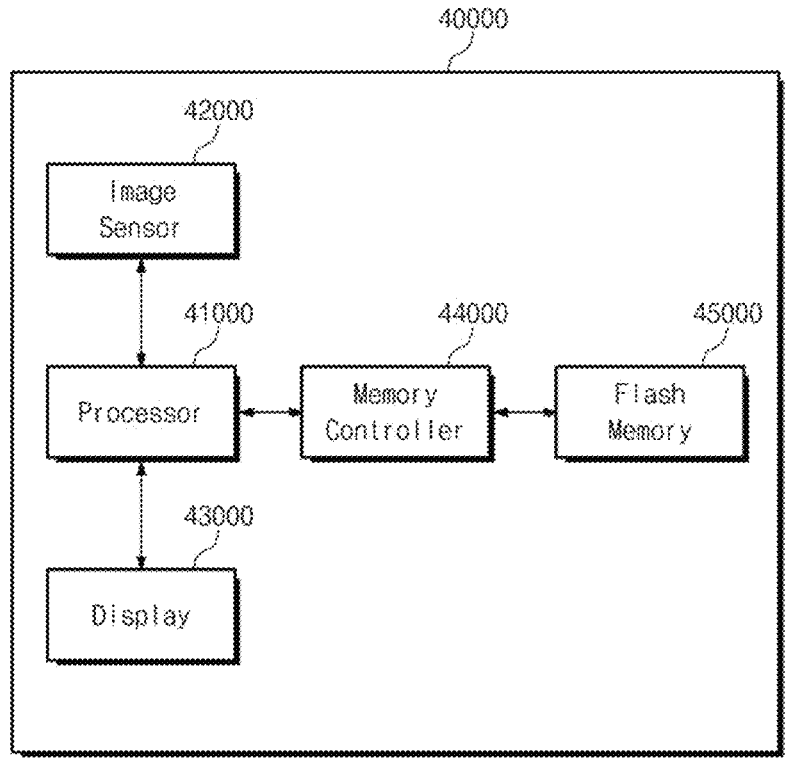

FIG. 16 is a block diagram illustrating an electronic device including a memory controller and a nonvolatile memory device according to embodiments of the inventive concept. Referring to FIG. 16, an electronic device 40000 may include a nonvolatile memory device 45000 such as a flash memory device, a memory controller 44000 controlling a data processing operation of the nonvolatile memory device 45000, and a processor 41000 controlling an overall operation of the electronic device 40000.

The nonvolatile memory device 45000 may correspond to a nonvolatile memory device described in relation to FIGS. 1 and 2. The nonvolatile memory device 45000 may be configured to verify programming of first data pattern using a first memory cell storing the first data pattern, a second memory cell programmed using a program voltage, and a verification voltage corresponding to the first data pattern. When a verification result of the first memory cell indicates a pass, programming of the second memory cell may be ended. The memory controller 44000 may correspond to a memory controller illustrated in FIG. 1.

An image sensor 42000 of the electronic device 40000 may convert an optical signal to a digital signal, and the digital signal may be stored in the nonvolatile memory device 45000 or displayed via a display 43000 under the control of the processor 41000.

Figure 17:
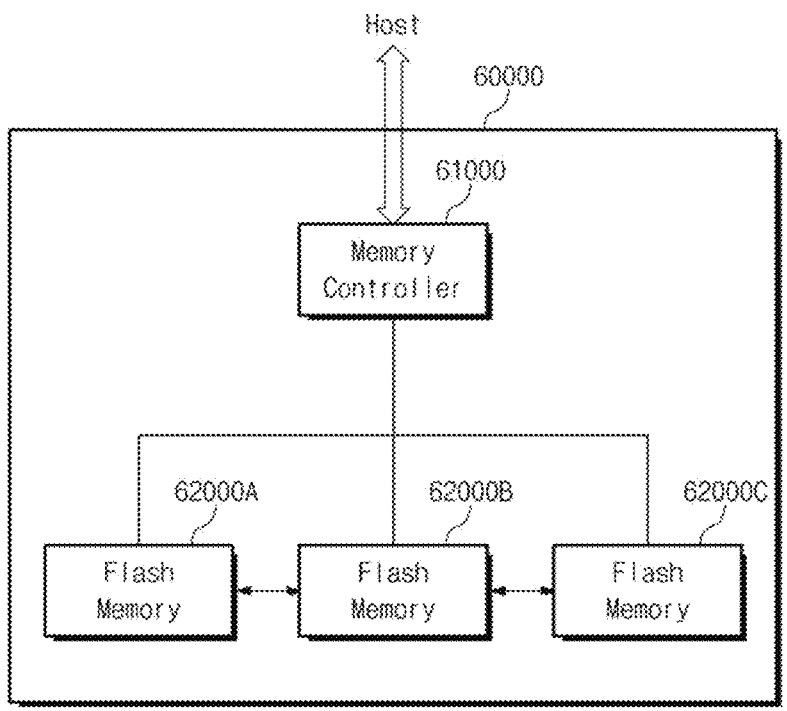

FIG. 17 is a block diagram illustrating an electronic device including a memory controller and nonvolatile memory devices according to embodiments of the inventive concept. Referring to FIG. 17, an electronic device 60000 may be implemented by a data storage device such as a Solid State Drive (SSD).

The electronic device 60000 may include a plurality of nonvolatile memory devices 62000A, 62000B, and 62000C and a memory controller 61000 controlling a data processing operation of each of the plurality of nonvolatile memory devices 62000A, 62000B, and 62000C. The electronic device 60000 may be implemented by a memory system or a memory module.

Each of the nonvolatile memory devices 62000A, 62000B, and 62000C may be a nonvolatile memory device described in FIGS. 1 and 2. Each of the nonvolatile memory devices 62000A, 62000B, and 62000C may be configured to verify programming of first data pattern using a first memory cell storing the first data pattern, a second memory cell programmed using a program voltage, and a verification voltage corresponding to the first data pattern. When a verification result of the first memory cell indicates a pass, programming of the second memory cell may be ended. The memory controller 61000 may correspond to a memory controller illustrated in FIG. 1.

In example embodiments, the memory controller 61000 may be provided at the interior or exterior of the electronic device 60000.

Figure 18:
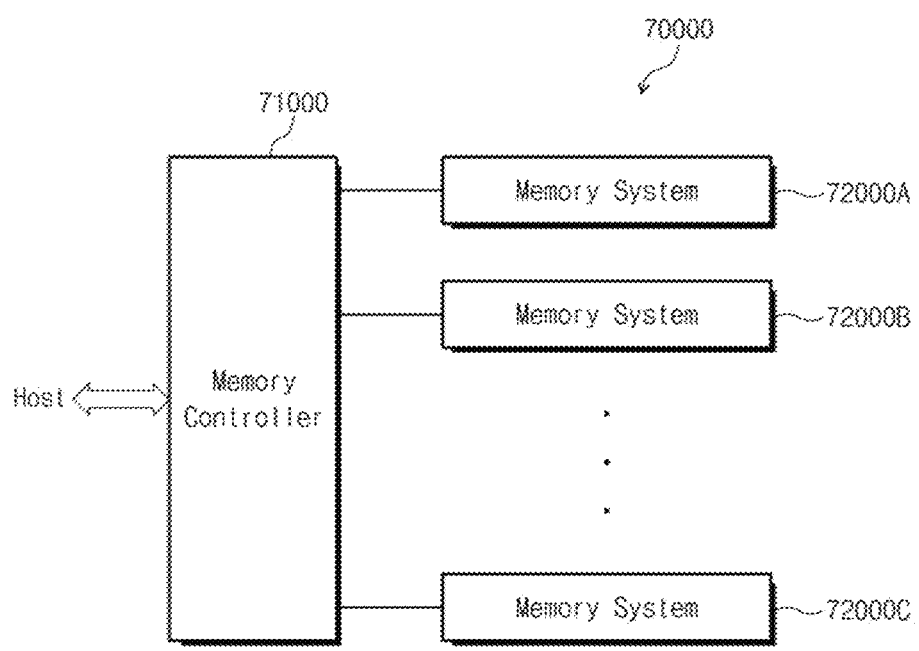

FIG. 18 is a block diagram illustrating a data processing system including an electronic device of FIG. 17. Referring to FIGS. 22 and 23, a data storage device 70000 may be implemented by a RAID (Redundant Array of Independent Disks) system, and may include a RAID controller 71000 and a plurality of memory systems 72000A to 72000C.

The memory systems 72000A to 72000C may be an electronic device 60000 illustrated in FIG. 17. The memory systems 72000A to 72000C may constitute a RAID array. The data storage device 70000 may be implemented by a personal computer or an SSD.

During a program operation, the RAID controller 71000 may output program data from a host to one of the memory systems 72000A to 72000C according to a RAID level, selected depending on RAID level information from the host, from among a plurality of RAID levels.

During a read operation, the RAID controller 71000 may provide the host with data read from one of the memory systems 72000A to 72000C according to a RAID level, selected depending on RAID level information from the host, from among a plurality of RAID levels.

The above-disclosed subject matter is to be considered illustrative, and not restrictive, and the appended claims are intended to cover all such modifications, enhancements, and other variations, which fall within the scope of the following claims. Thus, to the maximum extent allowed by law, the scope is to be determined by the broadest permissible interpretation of the following claims and their equivalents, and shall not be restricted or limited by the foregoing detailed description.

What is claimed is:

1. A method of operating a memory controller in a memory system including a nonvolatile memory device, the method comprising:

erasing memory cells of a target memory block of the non-volatile memory device on a block basis;

after erasing the memory cells of the target memory block, searching for a bad memory cell by a performing an erase verifying operation on the target memory block, the bad memory cell located in a sub-block among a plurality of sub-blocks of the target memory block;

comparing a threshold voltage of the bad memory cell to a plurality of reference voltages to generate comparison results; and selectively designating as a bad area either one of the entire target memory block or only a portion of target memory block in response to the comparison results, wherein the portion of the target memory block is less than the entire target memory block and includes the sub-block of the target memory block in which the bad memory cell is located.

2. The method of claim 1, wherein the sub-block of the target memory block in which the bad memory cell is located is one selected from a group including a bad word line connected to the bad memory cell, a bad word line connected to the bad memory cell and at least one word line disposed adjacent to the bad word line, and a word line group including a bad word line connected to the bad memory cell.

3. The method of claim 2, wherein the reference voltages comprise a first reference voltage and a second reference voltage higher than the first reference voltage, and comparing the threshold voltage to the reference voltages comprises determining whether the threshold voltage is higher or lower than the first reference voltage, and determining whether the threshold voltage is higher or lower than the second reference voltage.

4. The method of claim 3, wherein upon determining that the threshold voltage is lower than the first reference voltage providing a first comparison result, upon determining that the threshold voltage is higher than the first reference voltage and lower than the second reference voltage providing a second comparison result, and upon determining that the threshold voltage is higher than the second reference voltage providing a third comparison result.

5. The method of claim 4, wherein the entire target memory block is designated as a bad area only in response to the third comparison result.

6. The method of claim 4, wherein the sub-block of the target memory block in which the bad memory cell is located is designated as the bad area in response to either one of the first comparison result and the second comparison result.

7. The method of claim 6, further comprising:

executing a program/read operation directed to memory cells of the target memory block including the bad memory cell following designation of the sub-block of the target memory block as the bad area in response to the first comparison result by applying a nominal pass voltage to the bad word line connecting the bad memory cell that is the same a nominal pass voltage applied to good word lines connected to normal memory cells.

8. The method of claim 6, further comprising:
executing a program/read operation directed to memory cells of the target memory block including the bad memory cell following designation of the sub-block of the target memory block as the bad area in response to the second comparison result by applying an elevated pass voltage to the bad word line connecting the bad memory cell that is higher than a nominal pass voltage applied to good word lines connected to normal memory cells.

9. The method of claim 1, wherein the target memory block includes a plurality of memory cell layers stacked on a substrate to define a three-dimensional memory cell array, and the sub-block in which the bad memory cell is located is a bad memory layer among the plurality of memory layers.

10. The method of claim 1, further comprising:
receiving externally provided program data in the memory controller to be programmed in the nonvolatile memory device;
performing an error detection and/or correction (ECC) routine on the program data in the memory controller to generate ECC data associated with the program data,
wherein searching for the bad memory cell by a performing the erase verifying operation on the target memory block comprises performing respective erase verifying operations on a number of word line groups.

11. A method of operating a memory controller in a memory system including a nonvolatile memory device, the method comprising:
erasing memory cells of a target memory block of the non-volatile memory device on a block basis;
after erasing the memory cells of the target memory block, differentiating between normal memory cells and a bad memory cell by a performing an erase verifying operation on the target memory block;
comparing a threshold voltage of the bad memory cell to a reference voltage to generate one of first, second and third comparison results; and thereafter,
executing a program/read operation directed to memory cells of the target memory block only if the first comparison result or the second comparison results is generated, and during the execution of the program/read operation,
providing both good word lines connected to normal memory cells and a bad word line connected to the bad memory cell with a nominal pass voltage if the first comparison result is generated, else
providing only the good word lines with the nominal pass voltage while providing the bad word line with an elevated pass voltage higher than the nominal pass voltage if the second comparison result is generated.

12. The method of claim 11, wherein the reference voltage comprises a first reference voltage and a second reference voltage higher than the first reference voltage, and comparing the threshold voltage to the reference voltage comprises;
comparing the threshold voltage to the first reference voltage, and comparing the threshold voltage to the second reference voltage.

13. The method of claim 12, wherein upon determining that the threshold voltage is lower than the first reference voltage providing the first comparison result, upon determining that the threshold voltage is higher than the first reference voltage and lower than the second reference voltage providing the second comparison result, and
upon determining that the threshold voltage is higher than the second reference voltage providing the third comparison result.

14. The method of claim 13, wherein the entire target memory block is designated as a bad area in response to the third comparison result.

15. The method of claim 13, wherein a sub-block of the target memory block is designated as a bad area in response to either one of the first comparison result and the second comparison result.

16. A memory system comprising:
a nonvolatile memory device including a three dimensional memory cell array stacked on substrate and including a plurality of memory blocks each including a plurality of memory cell layers; and
a memory controller configured to control operation of the non-volatile memory device and including a bad area management unit configured to designate a bad area of the memory cell array including a bad memory cell,
wherein the bad area management unit is configured to erase a target block among the plurality of blocks, and then select a memory cell layer among the plurality of memory cell layers of the target memory block including the bad memory cell, compare a threshold voltage of the bad memory cell with a first reference voltage and a second reference voltage to generate a first comparison result, a second comparison result or a third comparison result, and
the bad area management unit is further configured to designate the entire target memory block as the bad area in response to the third comparison result, and a sub-block of the target memory block as the bad area in response to the first comparison result and the second comparison result.

17. The memory system of claim 16, wherein the sub-block of the target memory block is one selected from a group including; a bad word line connected to the bad memory cell, a bad word line connected to the bad memory cell and at least one word line disposed adjacent to the bad word line, and a word line group including a bad word line connected to the bad memory cell.

18. The memory system of claim 17, wherein upon determining that the threshold voltage is lower than the first reference voltage generating the first comparison result,
upon determining that the threshold voltage is higher than the first reference voltage and lower than the second reference voltage generating the second comparison result, and
upon determining that the threshold voltage is higher than the second reference voltage generating the third comparison result.

19. The memory system of claim 18, wherein the memory controller is further configured to execute a program/read operation directed to memory cells of the target memory block including the bad memory cell following designation of the sub-block of the target memory block as the bad area in response to the first comparison result by applying a nominal pass voltage to the bad word line connecting the bad memory cell that is the same a nominal pass voltage applied to good word lines connected to normal memory cells.

20. The memory system of claim 18, wherein the memory controller is further configured to execute a program/read operation directed to memory cells of the target memory block including the bad memory cell following designation of the sub-block of the target memory block as the bad area in response to the second comparison result by applying an elevated pass voltage to the bad word line connecting the bad memory cell that is higher than a nominal pass voltage applied to good word lines connected to normal memory cells.

* * * * *